(12) United States Patent
Xi et al.

(10) Patent No.: US 8,921,866 B2
(45) Date of Patent: Dec. 30, 2014

(54) ELECTROLUMINESCENT DISPLAY PANEL AND METHOD OF FABRICATING THE SAME

(71) Applicant: AU Optronics Corp., Hsin-Chu (TW)

(72) Inventors: Peng-Bo Xi, Hsin-Chu (TW); Yu-Chi Chen, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/088,447

(22) Filed: Nov. 25, 2013

(65) Prior Publication Data

US 2014/0319546 A1    Oct. 30, 2014

(30) Foreign Application Priority Data

Apr. 24, 2013 (TW) .............................. 102114655 A

(51) Int. Cl.
   *H01L 27/14*    (2006.01)
   *G02F 1/136*    (2006.01)
   *H01L 27/15*    (2006.01)

(52) U.S. Cl.
   CPC ..................................... *H01L 27/15* (2013.01)
   USPC ......... 257/72; 257/291; 257/E29.273; 349/43

(58) Field of Classification Search
   CPC ............ H01L 27/3211; H01L 27/3244; H01L 51/5016
   USPC .................. 257/72, 291, E29.273; 349/43, 69
   See application file for complete search history.

(56) References Cited

U.S. PATENT DOCUMENTS

| 7,985,974 | B2 | 7/2011 | Nowatari | |
|---|---|---|---|---|
| 2009/0159895 | A1* | 6/2009 | Cho et al. | 257/72 |
| 2012/0261671 | A1* | 10/2012 | Akimoto et al. | 257/72 |
| 2014/0183542 | A1* | 7/2014 | Yamazaki | 257/72 |

FOREIGN PATENT DOCUMENTS

JP    H05267671    10/1993

* cited by examiner

*Primary Examiner* — Jose R Diaz
(74) *Attorney, Agent, or Firm* — Winston Hsu; Scott Margo

(57) ABSTRACT

An electroluminescent display panel and method of fabricating the same are provided. The electroluminescent display panel includes a first multiple-layered structural layer, a second multiple-layered structural layer, a passivation layer and a third patterned conductive layer. The first multiple-layered structural layer includes a first patterned conductive layer, a first patterned insulation layer and an oxide semiconductor layer, and the first patterned conductive layer, the first patterned insulation layer and the oxide semiconductor layer have substantially the same shape. The second multiple-layered structural layer includes a second patterned conductive layer. The passivation layer has a plurality of through holes. A portion of the through holes expose the top surface and the lateral surface of the oxide semiconductor layer and the lateral surface of the first patterned conductive layer. The third patterned conductive layer is in contact with the oxide semiconductor layer and the first patterned conductive layer via the through holes.

16 Claims, 19 Drawing Sheets

ELECTROLUMINESCENT DISPLAY PANEL AND METHOD OF FABRICATING THE SAME

BACKGROUND OF THE INVENTION

1. Field of the Invention

The present disclosure relates to an electroluminescent display panel and a method of fabricating the same, and more particularly, to an electroluminescent display panel with lower parasitic capacitance and reduced cost and a method of fabricating the electroluminescent display panel with advantages of precise alignments and simplified processes.

2. Description of Related Art

Without a color filter but with the advantage of self-luminous characteristic (i.e., without a backlight module within a light source) and low power consumption, an electroluminescent display has been regarded as a promising candidate to replace LCD panels and becomes the display technology mainstream of the next generation for long. However, since the conventional electroluminescent display panel is limited by high manufacture cost, high parasitic capacitance, fabrication of great complexity and other issues, the electroluminescent display panel is still not popular. In addition, the conventional large-size electroluminescent display panel gradually utilizes oxide semiconductor devices as the drive element; however, since oxide semiconductor layers are transparent, it brings difficulties to align precisely in photolithography processes so that the yield of the electroluminescent display panel can hardly be improved.

SUMMARY

It is one of the objectives of the disclosure to provide an electroluminescent display panel and a method of fabricating the same so that oxide semiconductor layer can be aligned precisely in photolithography processes, the parasitic capacitance induced between adjacent wires can be reduced and the device properties of the switch thin film transistor device and the driving thin film transistor device are remained stable.

An embodiment of the disclosure provides an electroluminescent display panel including a substrate and one or a plurality of pixel structures. The pixel structures are disposed on the substrate and at least includes a first multiple-layered structural layer, a second multiple-layered structural layer, a passivation layer, a third patterned conductive layer, a luminous layer and a second electrode portion. The first multiple-layered structural layer is disposed on the substrate. The first multiple-layered structural layer includes a first patterned conductive layer, a first patterned insulation layer disposed on the first patterned conductive layer and an oxide semiconductor layer disposed on the first patterned insulation layer. The shape of the first patterned conductive layer, the shape of the first patterned insulation layer and the shape of the oxide semiconductor layer are substantially the same. The first multiple-layered structural layer at least has a data line portion, a first capacitor portion, a second capacitor portion, a first portion, a second portion, a first connection portion, a second connection portion and a first extension portion. The first connection portion is disposed between the first portion and the second capacitor portion and is connected to the first portion and the second capacitor portion. The second connection portion is disposed between the second portion and the second capacitor portion and is connected to the second portion and the second capacitor portion. The first extension portion is connected to the first capacitor portion. The first portion has a first source electrode region, a first drain electrode region and a first channel region disposed between the first source electrode region and the first drain electrode region. The second portion has a second source electrode region, a second drain electrode region and a second channel region disposed between the second source electrode region and the second drain electrode region. The second multiple-layered structural layer is disposed on the first multiple-layered structural layer. The second multiple-layered structural layer includes a second patterned insulation layer and a second patterned conductive layer disposed on the second patterned insulation layer. The shape of the second patterned insulation layer is substantially the same as the shape of the second patterned conductive layer. The second multiple-layered structural layer at least has a scan line portion, a first gate electrode portion, a second gate electrode portion, a third capacitor portion, a fourth capacitor portion, a second extension portion and a first power line portion. The first gate electrode portion is connected to the scan line portion and extends to the first portion. The second gate electrode portion is connected to the third capacitor portion and extends to the second portion. The third capacitor portion is disposed on the first capacitor portion. The fourth capacitor portion is disposed on the second capacitor portion. The second extension portion is connected to the third capacitor portion and extends to the first connection portion. The passivation layer covers and is disposed on the first multiple-layered structural layer, the second multiple-layered structural layer and the substrate. The passivation layer has a first through hole partially exposing a top surface and a side surface of the data line portion, a second through hole partially exposing the first drain electrode region of the first portion, a third through hole partially exposing the first source electrode region of the first portion, a fourth through hole partially exposing the second extension portion, at least one fifth through hole partially exposing the second source electrode region of the second portion, the fourth capacitor portion and the first extension portion respectively, a sixth through hole partially exposing the second drain electrode region of the second portion, and a seventh through hole partially exposing the first power line portion. The third patterned conductive layer is disposed on the passivation layer. The third patterned conductive layer has a first drain electrode, a first source electrode, a first electrode portion, a second drain electrode and a second source electrode. The first drain electrode is in contact with the data line portion via the first through hole and is in contact with the first drain electrode region of the first portion via the second through hole. The first source electrode is in contact with the first source electrode region of the first portion via the third through hole and is in contact with the second extension portion via the fourth through hole. The first electrode portion is disposed on the third capacitor portion and the fourth capacitor portion and is connected to the second source electrode. The second source electrode is in contact with the second source electrode region of the second portion, the fourth capacitor portion and the first extension portion via the fifth through hole respectively. The second drain electrode is in contact with the second drain electrode region of the second portion and the first power line portion via the sixth through hole and the seventh through hole. The luminous layer is disposed on the first electrode portion. The second electrode portion is disposed on the luminous layer.

Another embodiment of the disclosure provides a method of fabricating an electroluminescent display panel. The method of fabricating the electroluminescent display panel includes providing a substrate and forming one or a plurality of pixel structures on the substrate. The method of forming the one or a plurality of pixel structures at least includes the following steps. A first multiple-layered structural layer is formed on the substrate. The first multiple-layered structural layer includes a first patterned conductive layer, a first patterned insulation layer disposed on the first patterned conductive layer and an oxide semiconductor layer disposed on the first patterned insulation layer. The shape of the first patterned conductive layer, the shape of the first patterned insulation layer and the shape of the oxide semiconductor layer are substantially the same. The first multiple-layered structural layer at least has a data line portion, a first capacitor portion, a second capacitor portion, a first portion, a second portion, a first connection portion, a second connection portion and a first extension portion. The first connection portion is disposed between the first portion and the second capacitor portion and is connected to the first portion and the second capacitor portion. The second connection portion is disposed between the second portion and the second capacitor portion and is connected to the second portion and the second capacitor portion. The first extension portion is connected to the first capacitor portion. The first portion has a first source electrode region, a first drain electrode region and a first channel region disposed between the first source electrode region and the first drain electrode region. The second portion has a second source electrode region, a second drain electrode region and a second channel region disposed between the second source electrode region and the second drain electrode region. A second multiple-layered structural layer is formed on the first multiple-layered structural layer. The second multiple-layered structural layer includes a second patterned insulation layer and a second patterned conductive layer disposed on the second patterned insulation layer. The shape of the second patterned insulation layer is substantially the same as the shape of the second patterned conductive layer. The second multiple-layered structural layer at least has a scan line portion, a first gate electrode portion, a second gate electrode portion, a third capacitor portion, a fourth capacitor portion, a second extension portion and a first power line portion. The first gate electrode portion is connected to the scan line portion and extends to the first portion. The second gate electrode portion is connected to the third capacitor portion and extends to the second portion. The third capacitor portion is disposed on the first capacitor portion. The fourth capacitor portion is disposed on the second capacitor portion. The second extension portion is connected to the third capacitor portion and extends to the first connection portion. A passivation layer is formed on the first multiple-layered structural layer, the second multiple-layered structural layer and the substrate. The passivation layer has a first through hole partially exposing a top surface and a side surface of the data line portion, a second through hole partially exposing the first drain electrode region of the first portion, a third through hole partially exposing the first source electrode region of the first portion, a fourth through hole partially exposing the second extension portion, a fifth through hole partially exposing the second source electrode region of the second portion, the fourth capacitor portion and the first extension portion respectively, a sixth through hole partially exposing the second drain electrode region of the second portion, and a seventh through hole partially exposing the first power line portion. A third patterned conductive layer is formed on the passivation layer. The third patterned conductive layer has a first drain electrode, a first source electrode, a first electrode portion, a second drain electrode and a second source electrode. The first drain electrode is in contact with the data line portion via the first through hole and is in contact with the first drain electrode region of the first portion via the second through hole. The first source electrode is in contact with the first source electrode region of the first portion via the third through hole and is in contact with the second extension portion via the fourth through hole. The first electrode portion is disposed on the third capacitor portion and the fourth capacitor portion and is connected to the second source electrode. The second source electrode is in contact with the second source electrode region of the second portion, the fourth capacitor portion and the first extension portion via the fifth through hole respectively. The second drain electrode is in contact with the second drain electrode region of the second portion and the first power line portion via the sixth through hole and the seventh through hole. A luminous layer is formed on the first electrode portion. A second electrode portion is formed on the luminous layer.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present disclosure, features of the embodiments will be made in detail. The embodiments of the present disclosure are illustrated in the accompanying drawings with numbered elements. In addition, the terms such as "first" and "second" described in the present disclosure are used to distinguish different components or processes, which do not limit the sequence of the components or processes.

Figure 1:
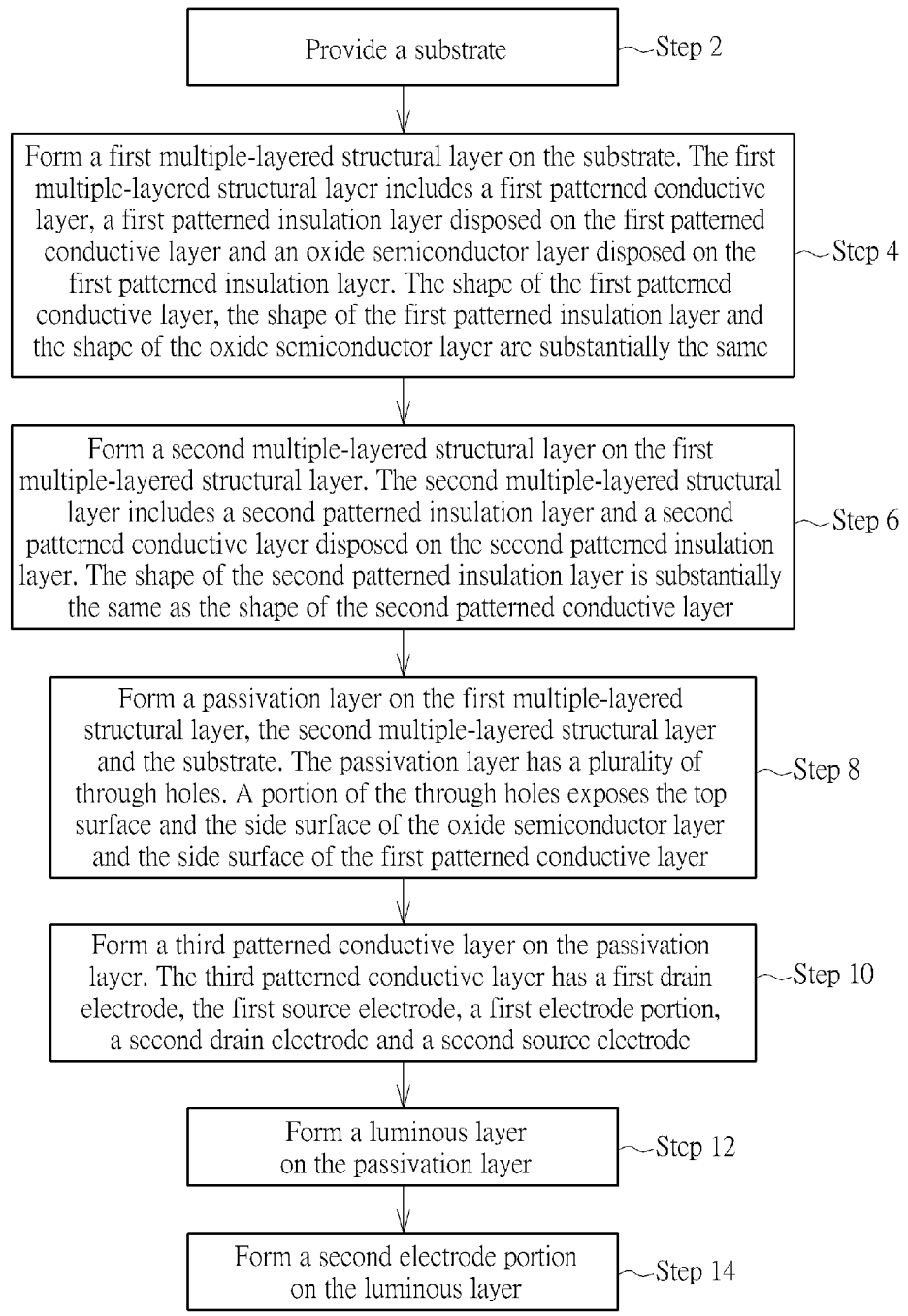
FIG. 1 is a flow schematic diagram illustrating a method of fabricating a display panel according to this disclosure.

Please refer to FIG. 1. FIG. 1 is a flow schematic diagram illustrating a method of fabricating a display panel according to this disclosure. As shown in FIG. 1, the method of fabricating the display panel includes:

Step 2: Provide a substrate.

Step 4: Form a first multiple-layered structural layer on the substrate. The first multiple-layered structural layer includes a first patterned conductive layer, a first patterned insulation layer disposed on the first patterned conductive layer and an oxide semiconductor layer disposed on the first patterned insulation layer. Moreover, the shape of the first patterned conductive layer, the shape of the first patterned insulation layer and the shape of the oxide semiconductor layer are substantially the same. Features, locations, connection relations and material properties of relevant components will be illustrated as follows.

Step 6: Form a second multiple-layered structural layer on the first multiple-layered structural layer. The second multiple-layered structural layer includes a second patterned insulation layer and a second patterned conductive layer disposed on the second patterned insulation layer. Moreover, the shape of the second patterned insulation layer is substantially the same as the shape of the second patterned conductive layer. Features, locations, connection relations and material properties of relevant components will be illustrated as follows.

Step 8: Form a passivation layer on the first multiple-layered structural layer, the second multiple-layered structural layer and the substrate. The passivation layer has a plurality of through holes. A portion of the through holes exposes the top surface and the side surface of the oxide semiconductor layer and the side surface of the first patterned conductive layer. Features, locations, connection relations and material properties of relevant components will be illustrated as follows.

Step 10: Form a third patterned conductive layer on the passivation layer. The third patterned conductive layer has a first drain electrode, the first source electrode, a first electrode portion, a second drain electrode and a second source electrode. Features, locations, connection relations and material properties of relevant components will be illustrated as follows.

Step 12: Form a luminous layer on the passivation layer.

Step 14: Form a second electrode portion on the luminous layer.

The method of fabricating the display panel in the present disclosure may be applied to fabricate various display panels. Embodiments in the following paragraphs take the method of fabricating an electroluminescent display panel, such as an organic light emitting diode (OLED) display panel, as an example, but not limited thereto.

Figure 2:
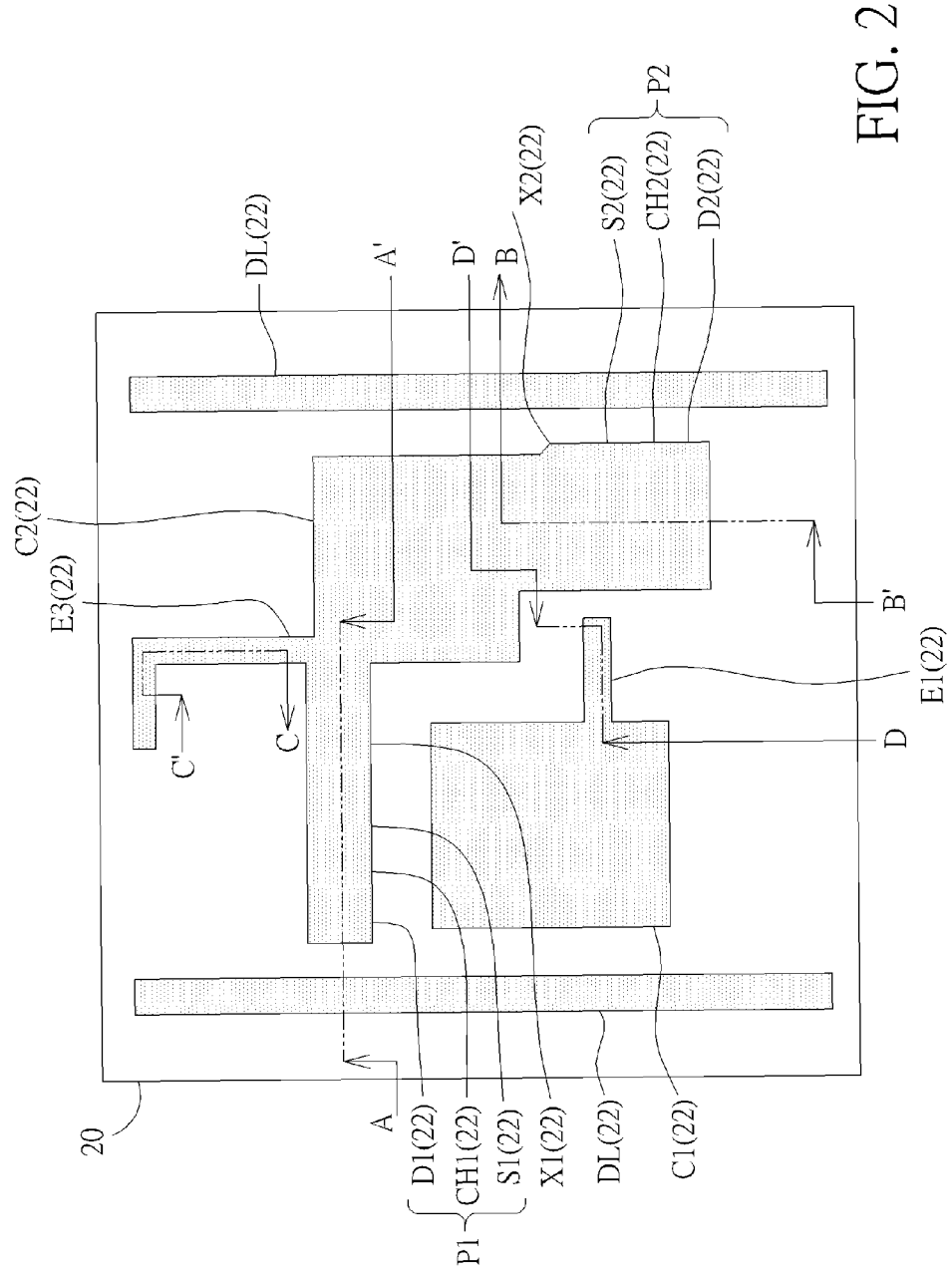
FIGS. 2-10 are schematic diagrams illustrating a method for fabricating an electroluminescent display panel according to a first embodiment of the present disclosure.
Figure 3:
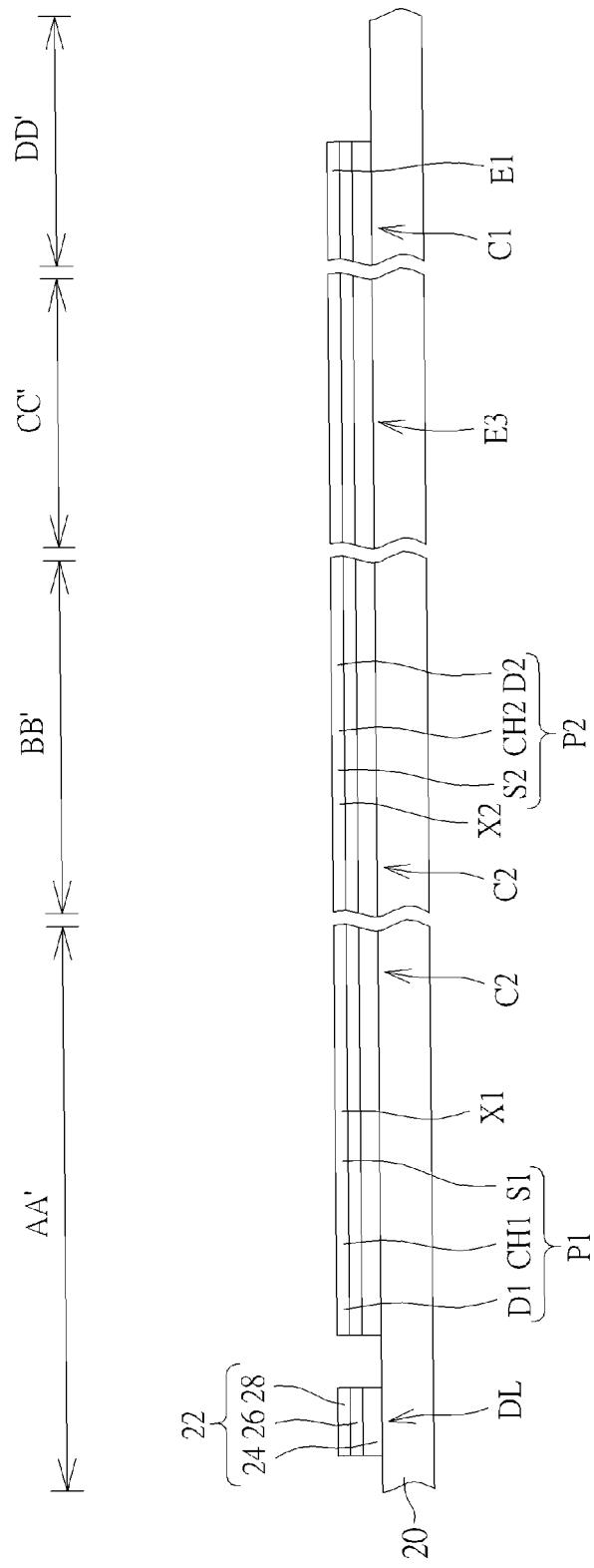

Please refer to FIGS. 2-10. FIGS. 2-10 are schematic diagrams illustrating a method for fabricating an electroluminescent display panel according to a first embodiment of the present disclosure. FIG. 2, FIG. 4, FIG. 6 and FIG. 8 are top-view schematic diagrams, while FIG. 3, FIG. 5, FIG. 7, FIG. 9 and FIG. 10 are cross-sectional view diagrams taken along cross-sectional lines A-A', B-B', C-C' and D-D' in FIG. 2, FIG. 4, FIG. 6 and FIG. 8. As shown in FIG. 2 and FIG. 3, a substrate 20 is first provided. The substrate 20 may include a hard substrate, such as a glass substrate, or a flexible substrate, such as a plastic substrate, but not limited thereto. Then, one or a plurality of pixel structures are formed on the substrate 20. The figures of this embodiment are based on the example of forming one single pixel structure. The method of forming the pixel structure includes at least the steps as follows. A first multiple-layered structural layer 22 is formed on the substrate 20. The first multiple-layered structural layer 22 includes a first patterned conductive layer 24, a first patterned insulation layer 26 disposed on the first patterned conductive layer 24 and an oxide semiconductor layer 28 disposed on the first patterned insulation layer 26. The first multiple-layered structural layer 22 at least has a data line portion DL, a first capacitor portion C1, a second capacitor portion C2, a first portion P1, a second portion P2, a first connection portion X1, a second connection portion X2 and a first extension portion E1. The first connection portion X1 is disposed between the first portion P1 and the second capacitor portion C2 and is connected to the first portion P1 and the second capacitor portion C2. The second connection portion X2 is disposed between the second portion P2 and the second capacitor portion C2 and is connected to the second portion P2 and the second capacitor portion C2. The first extension portion E1 is connected to the first capacitor portion C1. Moreover, the first portion P1 has a first source region S1 (or namely first source electrode region), a first drain region D1 (or namely first drain electrode region) and a first channel region CH1 disposed between the first source electrode region S1 and the first drain electrode region D1. The second portion P2 has a second source region S2 (or namely second source electrode region), a second drain region D2 (or namely second drain electrode region) and a second channel region CH2 disposed between the second source electrode region S2 and the second drain electrode region D2. In addition, the first multiple-layered structural layer 22 may further selectively include a third extension portion E3 connecting the first connection portion X1 and the second capacitor portion C2. In this embodiment, the first patterned conductive layer 24 may be a single-layered or multiple-layered structure. Moreover, the first patterned conductive layer 24 may include opaque patterned conductive materials, and the opaque patterned conductive materials may be metal, such as at least one among gold (Au), silver (Ag), copper (Cu), aluminum (Al), titanium (Ti), molybdenum (Mo), niobium (Nb), alloys thereof, nitride thereof, oxide thereof, oxynitride thereof, or organic conductive compounds thereof, but not limited thereto. The first patterned insulation layer 26 may be a single-layered or multiple-layered structure. Moreover, the first patterned insulation layer 26 may include inorganic insulation materials, such as at least one among silicon oxide, silicon nitride, silicon oxynitride or other appropriate materials, or organic insulation materials, such as at least one among photoresist, benzocyclobutene (BCB), polymethylmethacrylate (PMMA), polyimide (PI) or other appropriate materials. The oxide semiconductor layer 28 may be a single-layered or multiple-layered structure. Moreover, the material of the oxide semiconductor layer 28 preferably includes indium gallium zinc oxide (IGZO), but not limited thereto. The material of the oxide semiconductor layer 28 may also include materials, such as indium zinc tin oxide (IZTO), indium aluminum zinc oxide (IAZO), indium gallium tin oxide (IGTO), aluminum zinc oxide (AZO), antimony tin oxide (ATO), gallium zinc oxide (GZO) or other oxide semiconductor materials. In this embodiment, the first patterned conductive layer 24, the first patterned insulation layer 26 and the oxide semiconductor layer 28 are patterned in the same photo and etching process (PEP), and hence the shape of the first patterned conductive layer 24, the shape of the first patterned insulation layer 26 and the shape of the oxide semiconductor layer 28 are substantially the same. For example, if the aforementioned elements are projected onto a plane, the contours of the aforementioned elements are substantially the same. The first patterned conductive layer 24 of this embodiment is an opaque patterned conductive layer and can be used as an alignment pattern for improving accuracy and precision of alignment operations in photolithography machines. In other embodiment, the first patterned conductive layer 24, the first patterned insulation layer 26 and the oxide semiconductor layer 28 are patterned in the different photo and etching process (PEP), and the shape of the first patterned conductive layer 24, the shape of the first patterned insulation layer 26 and the shape of the oxide semiconductor layer 28 to formed the shaped structure of the first multiple-layered structural layer 22 is taper or taper-like shaped structure.

Figure 4:
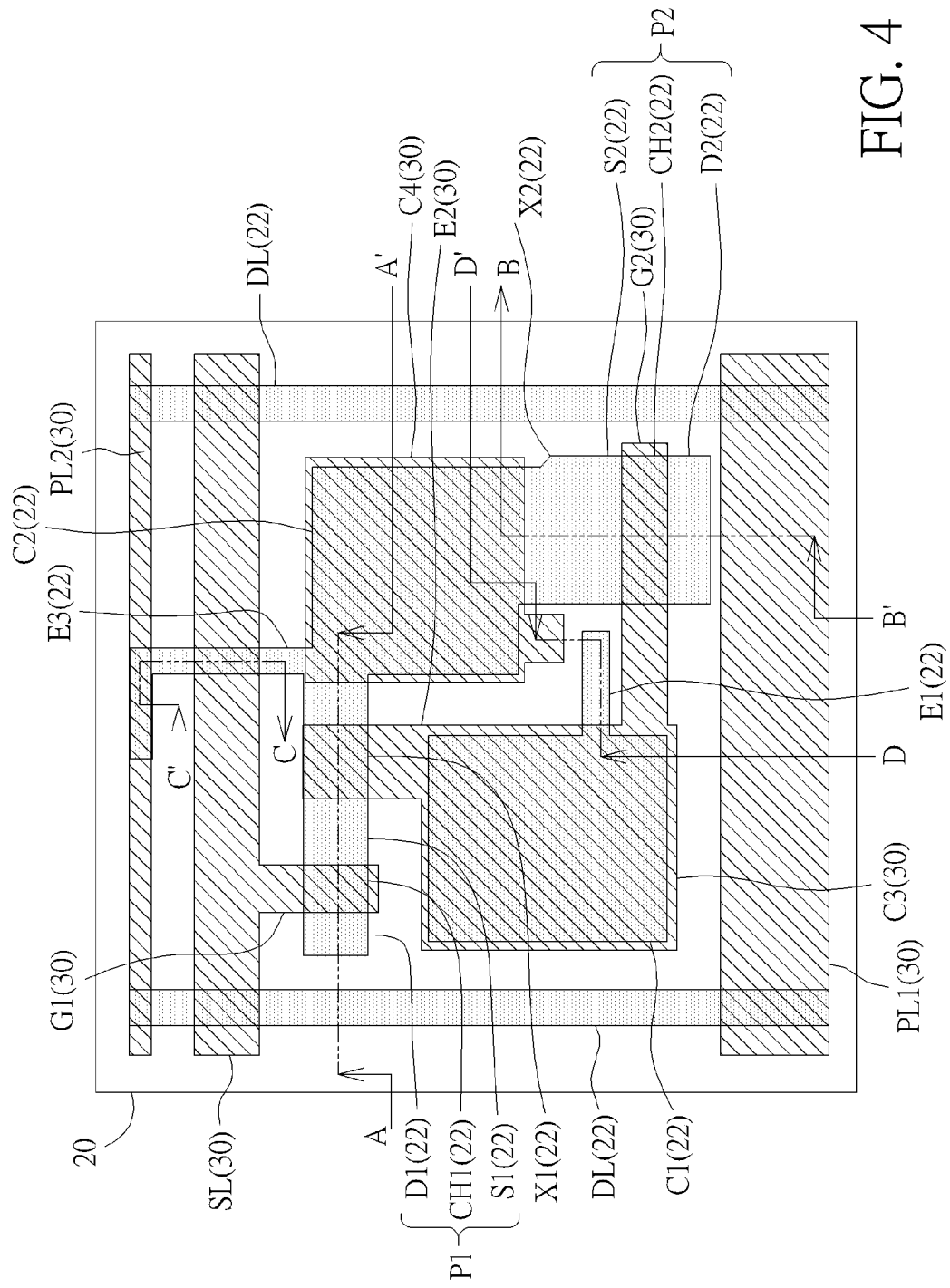
Figure 5:
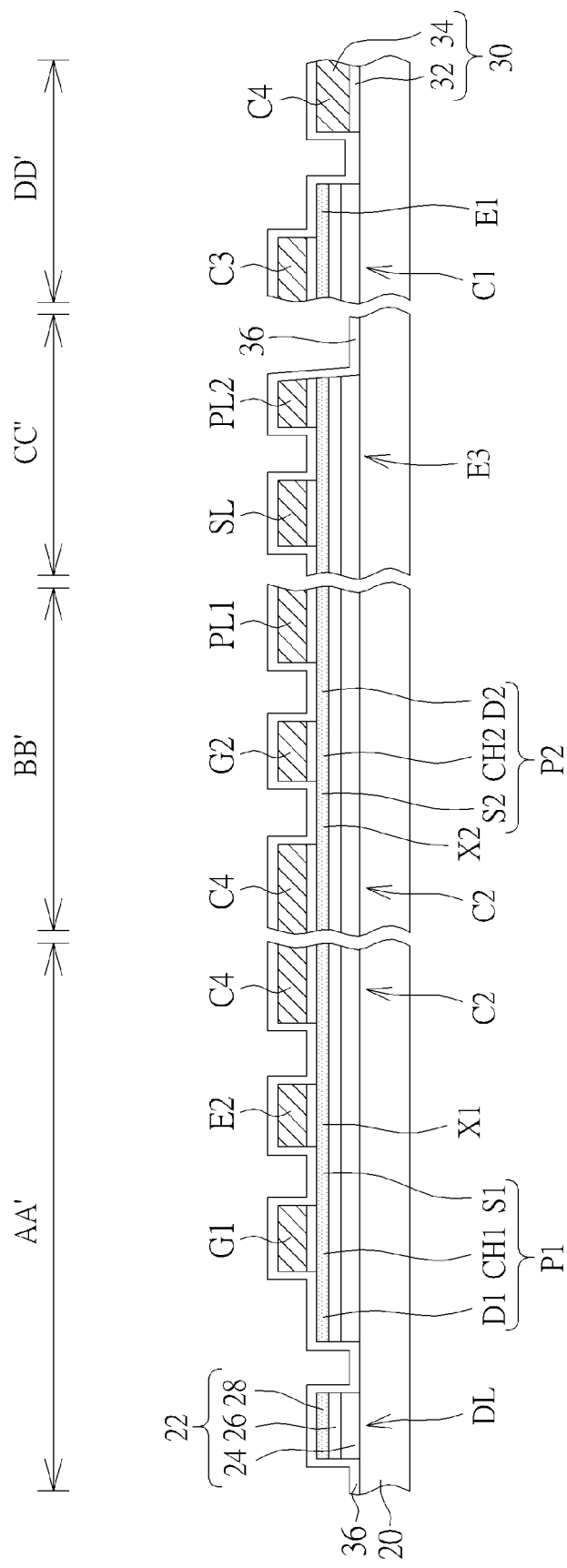

As shown in FIG. 4 and FIG. 5, a second multiple-layered structural layer 30 is subsequently formed on the first multiple-layered structural layer 22. The second multiple-layered structural layer 30 includes a second patterned insulation layer 32 and a second patterned conductive layer 34 disposed on second patterned insulation layer 32. The second multiple-layered structural layer 30 at least has a scan line portion SL, a first gate electrode portion G1, the second gate electrode portion G2, a third capacitor portion C3, a fourth capacitor portion C4, a second extension portion E2 and a first power line portion PL1. The first gate electrode portion G1 is connected to the scan line portion SL and extends to the first portion P1, and the first gate electrode portion G1 substantially corresponds to the first channel region CH1. The second gate electrode portion G2 is connected to the third capacitor portion C3 and extends to the second portion P2, and the second gate electrode portion G2 substantially corresponds to the second channel region CH2. The third capacitor portion C3 is disposed on the first capacitor portion C1. The first capacitor portion C1 and the third capacitor portion C3 constitute a storage capacitor (or referred to as a first storage capacitor). The fourth capacitor portion C4 is disposed on the second capacitor portion C2. The second capacitor portion C2 and the fourth capacitor portion C4 constitute another storage capacitor (or referred to as a second storage capacitor). The second extension portion E2 is connected to the third capacitor portion C3 and extends to the first connection portion X1. The second multiple-layered structural layer 30 may further selectively include a second power line portion PL2. The voltage of the second power line portion PL2 is different from the voltage of the first power line portion PL1. For example, the first power line portion PL1 has a drive voltage, and the second power line portion PL2 has a reference voltage, which may be fixed (constant) voltage such as about 0 voltage or less than 0 voltages, or the second power line portion PL2 may be electrically grounded. The third extension portion E3 of the first multiple-layered structural layer 22 may extend to the second power line portion PL2 and partially overlap the second power line portion PL2. The second patterned insulation layer 32 may be a single-layered or multiple-layered structure. Moreover, the second patterned insulation layer 32 may include inorganic insulation materials, such as at least one among silicon oxide, silicon nitride, silicon oxynitride and other appropriate materials, or organic insulation materials, such as at least one among photoresist, benzocyclobutene, polymethylmethacrylate, polyimide and other appropriate materials. The second patterned conductive layer 34 may be a single-layered or multiple-layered structure. Moreover, the second patterned conductive layer 34 may include opaque patterned conductive materials, and opaque patterned conductive materials may be metal, such as at least one among gold (Au), silver (Ag), copper (Cu), aluminum (Al), titanium (Ti), molybdenum (Mo), niobium (Nb), alloys thereof, nitride thereof, oxide thereof, oxynitride thereof or organic conductive compounds thereof, but not limited thereto. In this embodiment, the second patterned insulation layer 32 and the second patterned conductive layer 34 are patterned in the same photo and etching process, and hence the shape of the second patterned insulation layer 32 is substantially the same as the shape of the second patterned conductive layer 34. For example, if the aforementioned elements are projected onto a plane, the contours of the aforementioned elements are substantially the same. In other embodiment, the second patterned insulation layer 32 and the second patterned conductive layer 34 are patterned in the different photo and etching process (PEP), and the shape of the shape of the second patterned insulation layer 32 and the shape of the second patterned conductive layer 34 to formed the shaped structure of the second multiple-layered structural layer 30 is taper or taper-like shaped structure.

In this embodiment, the second multiple-layered structural layer 30 covers a portion of the first multiple-layered structural layer 22 and exposes a portion of the first multiple-layered structural layer 22. For example, the second multiple-layered structural layer 30 exposes a portion of the data line portion DL of the first multiple-layered structural layer 22, the first source electrode region S1, the first drain electrode region D1, the second source electrode region S2, the second drain electrode region D2, a portion of the first connection portion X1, the first extension portion E1 and a portion of the third extension portion E3. In order to enhance the conductivity of the elements mentioned above, the method in the present disclosure may further selectively include performing conductivity-enhancing treatment on the first multiple-layered structural layer 22 exposed by the second multiple-layered structural layer 30. As shown in FIG. 5, the conductivity-enhancing treatment in this embodiment may include the steps as follows. A metal layer 36 (not shown in FIG. 4) is formed on the substrate 20, the first multiple-layered structural layer 22 and the second multiple-layered structural layer 30. The metal layer 36 is in contact with a portion of the substrate 20, the second multiple-layered structural layer 30 and a portion of the oxide semiconductor layer 28 of the first multiple-layered structural layer 22 exposed by the second multiple-layered structural layer 30. Then, an annealing process is performed on the metal layer 36. In the annealing process, the metal layer 36 may be reacted with gas within oxygen flowing in and form a metal oxide layer. Additionally, the metal layer 36 may also obtain oxygen from the oxide semiconductor layer 28 so that the oxygen content in the oxide semiconductor layer 28 in contact with the metal layer 36 decreases. Since the conductivity of the oxide semiconductor with a low oxygen content is greater higher than the conductivity of the oxide semiconductor with a high oxygen content, the aforementioned process can effectively enhance the conductivity of the oxide semiconductor layer 28 exposed by the second multiple-layered structural layer 30. In other words, the conductivity of a portion of the data line portion DL of the first multiple-layered structural layer 22, the conductivity of the first source electrode region S1, the conductivity of the first drain electrode region D1, the conductivity of the second source electrode region S2, the conductivity of the second drain electrode region D2, the conductivity of a portion of the first connection portion X1, the conductivity of the first extension portion E1 and the conductivity of a portion of the third extension portion E3 exposed by the second multiple-layered structural layer 30 are substantially higher than the conductivity of other portion of the first multiple-layered structural layer 22 covered by the second multiple-layered structural layer 30. Moreover, because the aforementioned conductivity-enhancing treatment is a self-aligned process, no extra mask is required and no extra cost is added. Furthermore, the metal oxide layer also well protects the elements under. In this embodiment, the metal layer 36 may include, such as a layer main contain aluminum, but not limited thereto. For example, as far as the material is concerned, the electronegativity of the material of the metal layer 36 should be substantially higher than the electronegativity of the metal element in the oxide semiconductor layer 28. However, the conductivity-enhancing treatment of the present disclosure is not limited to the above-mentioned embodiments. For example, the conductivity-enhancing treatment may include performing an ion implantation process to dope the oxide semiconductor layer 28 exposed by the second multiple-layered structural layer 30, performing a thermal process to change the lattice arrangement of the oxide semiconductor layer 28 exposed by the second multiple-layered structural layer 30, or irradiating the oxide semiconductor layer 28 exposed by the second multiple-layered structural layer 30 with laser light so as to enhance the conductivity of a portion of the data line portion DL, the conductivity of the first source electrode region S1, the conductivity of the first drain electrode region D1, the conductivity of the second source electrode region S2, the conductivity of the second drain electrode region D2, the conductivity of a portion of the first connection portion X1, the conductivity of the first extension portion E1 and the conductivity of a portion of the third extension portion E3.

Figure 6:
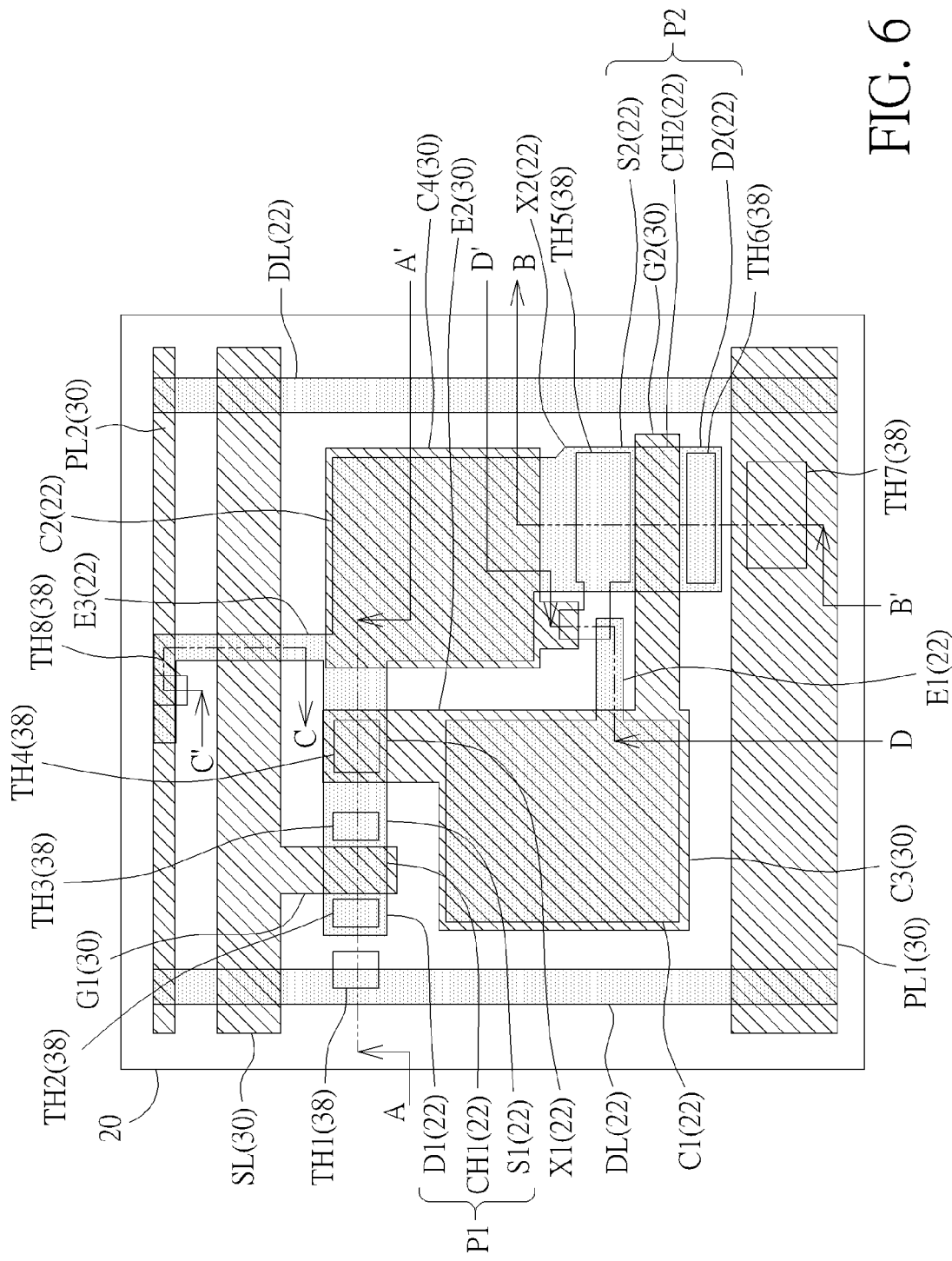
Figure 7:
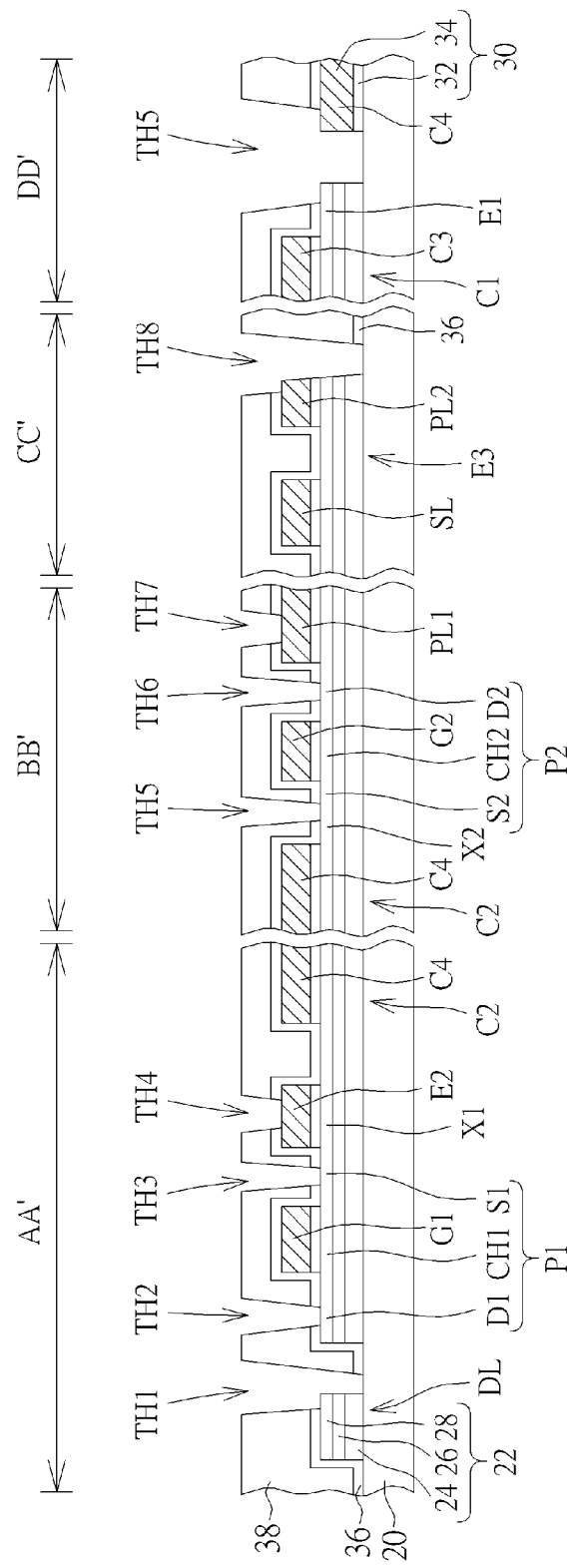

As shown in FIG. 6 and FIG. 7, a passivation layer 38 is then formed to cover the first multiple-layered structural layer 22, the second multiple-layered structural layer 30 and the substrate 20. The passivation layer 38 has a first contact hole TH1 (or namely first through hole), a second through hole TH2, a third through hole TH3, a fourth through hole TH4, a fifth through hole TH5, a sixth through hole TH6 and a seventh through hole TH7. The first through hole TH1 preferably corresponds to a portion of the top surface and a portion of the side surface of the data line portion DL. The second through hole TH2 corresponds to a portion of the first drain electrode region D1 of the first portion P1. The third through hole TH3 corresponds to a portion of the first source electrode region S1 of the first portion P1. The fourth through hole TH4 corresponds to a portion of the second extension portion E2. The fifth through hole TH5 corresponds to a portion of the second source electrode region S2 of the second portion P2, a portion of the fourth capacitor portion C4 and a portion of the first extension portion E1. The sixth through hole TH6 corresponds to a portion of the second drain electrode region D2 of the second portion P2. The seventh through hole TH7 corresponds to a portion of the first power line portion PL1. In addition, the passivation layer 38 may further have an eighth through hole TH8. The eighth through hole TH8 corresponds to a portion of the second power line portion PL2 and a portion of the third extension portion E3. In this embodiment, the passivation layer 38 may be a planarization layer, which has a flat top surface. The passivation layer 38 may be a single-layered or multiple-layered structure. Moreover, the material of the passivation layer 38 may be organic insulation materials, such as at least one among photosensitive materials, benzocyclobutene, polymethylmethacrylate, polyimide, acrylate, epoxy resin and other appropriate materials, or inorganic insulation materials, such as silicon oxide, silicon nitride, silicon oxynitride and other appropriate materials. In this embodiment, the material of the passivation layer 38 may be exemplarily embodied as photosensitive materials, and the aforementioned through holes may be formed by exposure processes and development processes. Then, an etching process, such as a dry etching process, is performed to remove the metal layer 36 exposed by the above-mentioned through holes. Therefore, the first through hole TH1 preferably exposes a portion of the top surface and a portion of the side surface of the data line portion DL. The second through hole TH2 partially exposes the first drain electrode region D1 of the first portion P1. The third through hole TH3 partially exposes the first source electrode region S1 of the first portion P1. The fourth through hole TH4 partially exposes the second extension portion E2. The fifth through hole TH5 exposes a portion of the second source electrode region S2 of the second portion P2, a portion of the fourth capacitor portion C4 and a portion of the first extension portion E1. The sixth through hole TH6 partially exposes the second drain electrode region D2 of the second portion P2. The seventh through hole TH7 partially exposes the first power line portion PL1. The eighth through hole TH8 exposes a portion of the second power line portion PL2 and a portion of the third extension portion E3. In this embodiment, a portion of the through holes, such as the second through hole TH2, the third through hole TH3, the fourth through hole TH4, the sixth through hole TH6 and the seventh through hole TH7, completely overlaps the regions for the wires intentionally to be exposed—that is to say, only the top surface of the wires intended to be exposed are exposed by the portion of the through holes. Other portion of the through holes, such as at least one of the first through hole TH1, the fifth through hole TH5 and the eighth through hole TH8, does not completely overlap the regions for the wires intentionally to be exposed but with position deviation. More specifically, preferably, a portion of the first through hole TH1 covers the top surface of the data line portion DL while the other portion does not so that the first through hole TH1 can expose a portion of the top surface and a portion of the side surface of the data line portion DL. Because the data line portion DL of this embodiment is a triple-layered structure stacked by the first patterned conductive layer 24, the first patterned insulation layer 26 and the oxide semiconductor layer 28, and because the top surface and the side surface of the oxide semiconductor layer 28 and the side surface of the first patterned conductive layer 24 can be exposed simultaneously in one single etching process with the deviation between the first through hole TH1 and the data line portion DL, the first drain electrode formed subsequently can be electrically connected to the first patterned conductive layer 24 and the oxide semiconductor layer 28 simultaneously via the first through hole TH1. Similarly, the fifth through hole TH5 exposes a portion of the top surface and a portion of the side surface of the first extension portion E1—namely, the fifth through hole TH5 exposes the top surface and the side surface of the oxide semiconductor layer 28 and the side surface of the first patterned conductive layer 24—so that the second source electrode formed subsequently can be electrically connected to the first patterned conductive layer 24 and the oxide semiconductor layer 28 simultaneously via the fifth through hole TH5. Furthermore, the eighth through hole TH8 exposes a portion of the side surface of the second power line portion PL2 and a portion of the side surface of the third extension portion E3—that is, the eighth through hole TH8 exposes the top surface of the second patterned conductive layer 34, the side surface of the oxide semiconductor layer 28 and the side surface of the first patterned conductive layer 24—so that the third connection portion formed subsequently can be electrically connected to the second patterned conductive layer 34, the first patterned conductive layer 24 and the oxide semiconductor layer 28 simultaneously via the eighth through hole TH8. Moreover, in this embodiment, the fifth through hole TH5 may be one single through hole simultaneously exposing the second source electrode region S2, a portion of the fourth capacitor portion C4 and a portion of the first extension portion E1. However, in a variant embodiment, the fifth through hole TH5 may be a plurality of through holes respectively exposing the second source electrode region S2, a portion of the fourth capacitor portion C4 and a portion of the first extension portion E1.

Figure 8:
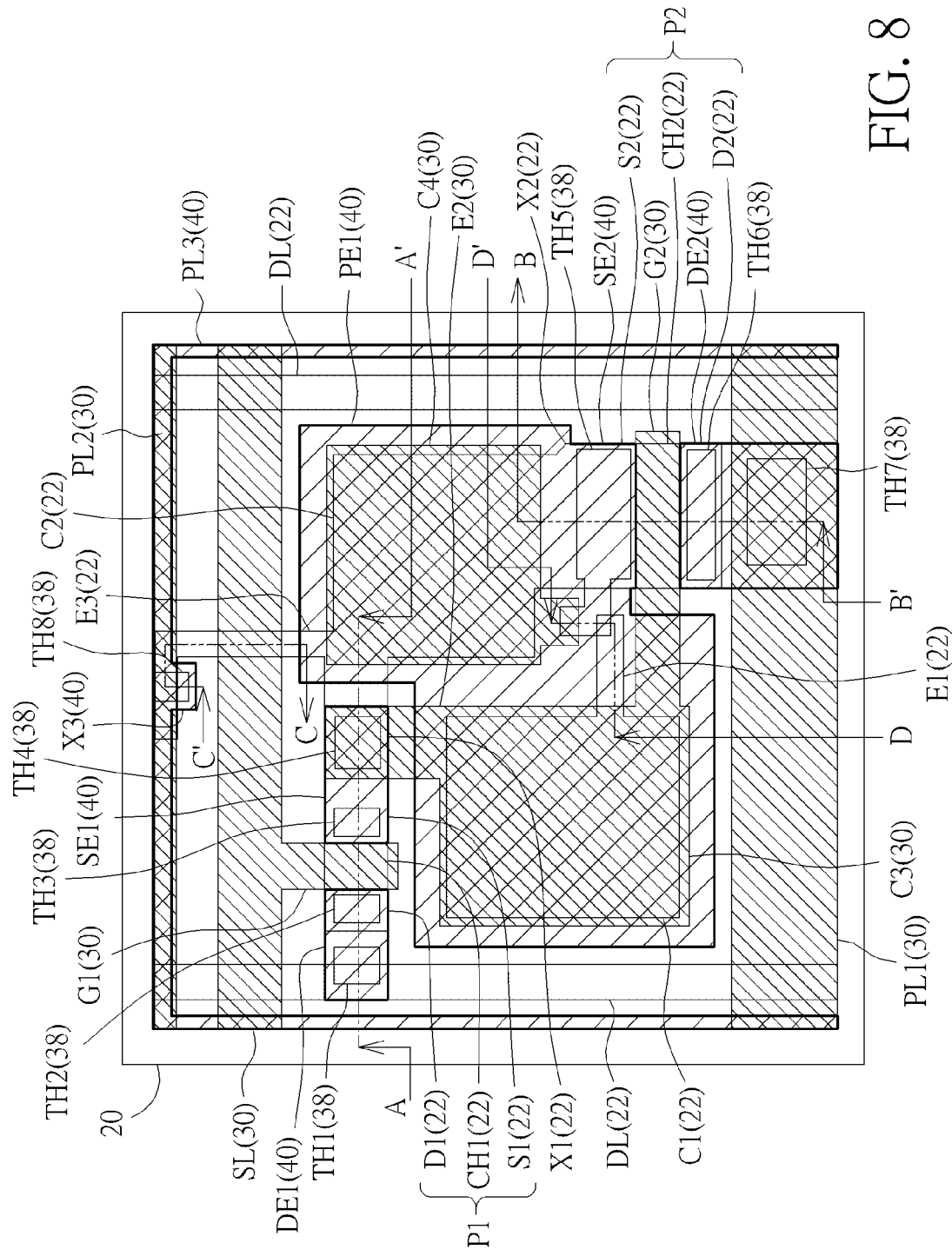
Figure 9:
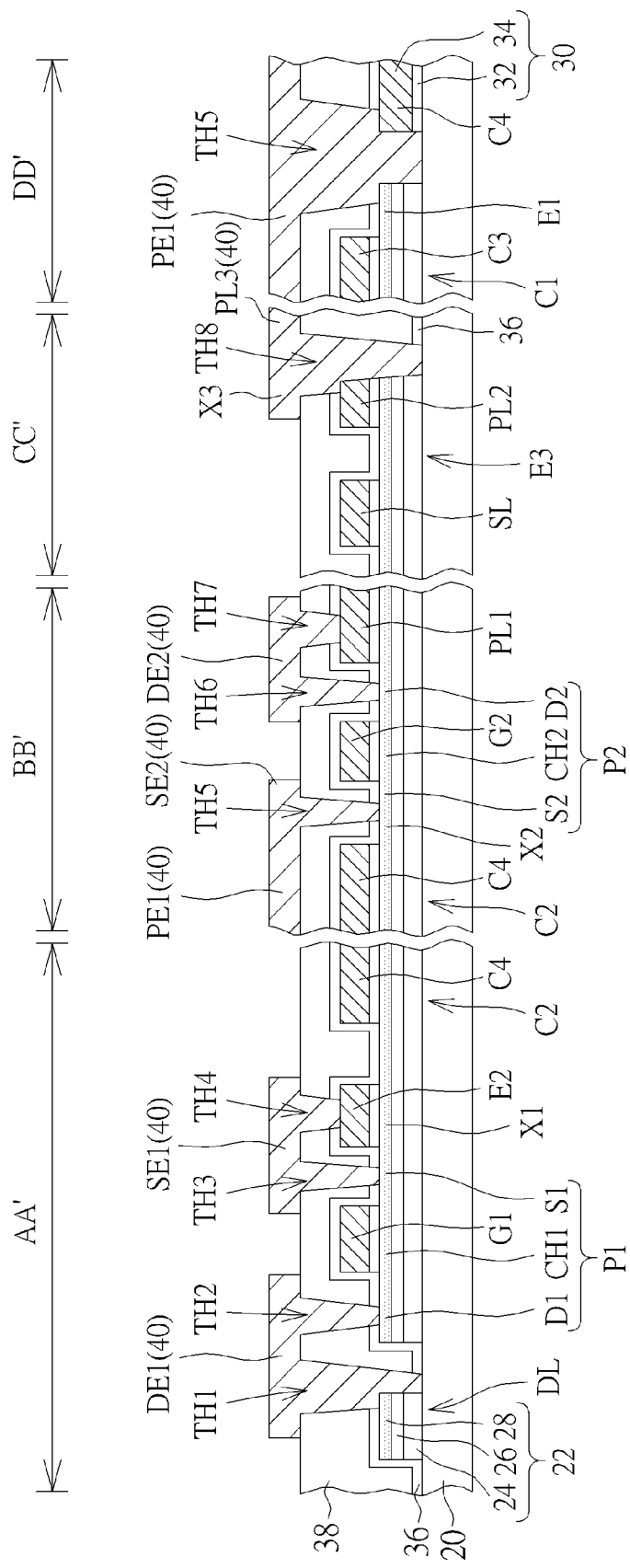

As shown in FIG. 8 and FIG. 9, a third patterned conductive layer 40 is subsequently formed on the passivation layer 38. The third patterned conductive layer 40 has a first drain electrode DE1, the first source electrode SE1, a first electrode portion PE1, a second drain electrode DE2 and a second source electrode SE2. The first drain electrode DE1 is in contact with the data line portion DL via the first through hole TH1 and in contact with the first drain electrode region D1 of the first portion P1 via the second through hole TH2. The first source electrode SE1 is in contact with the first source electrode region S1 of the first portion P1 via the third through hole TH3 and in contact with the second extension portion E2 via the fourth through hole TH4. The first electrode portion PE1 is disposed on the third capacitor portion C3 and the fourth capacitor portion C4 and is connected to the second source electrode SE2. The second source electrode SE2 is respectively in contact with the second source electrode region S2, the fourth capacitor portion C4 and the first extension portion E1 of the second portion P2 via the fifth through hole TH5. The second drain electrode DE2 is respectively in contact with the second drain electrode region D2 and the first power line portion PL1 of the second portion P2 via the sixth through hole TH6 and the seventh through hole TH7. The first gate electrode portion G1, the first channel region CH1, the first patterned conductive layer 24 disposed beneath the first channel region CH1 to be abase electrode, the first drain electrode DE1 and the first source electrode SE1 constitute a four-endpoint thin film transistor device serving as a switch thin film transistor device. The second gate electrode portion G2, the second channel region CH2, the first patterned conductive layer 24 disposed beneath the second channel region CH2 to be a base electrode, the second drain electrode DE2 and the second source electrode SE2 constitute another four-endpoint thin film transistor device serving as a driving thin film transistor device. Furthermore, in this embodiment, the third patterned conductive layer 40 may further selectively have a third connection portion X3. The third connection portion X3 is in contact with the second power line portion PL2 and the third extension portion E3 via the eighth through hole TH8. In other words, the third connection portion X3 can be electrically connected to the second power line portion PL2 and the first patterned conductive layer 24 via the eighth through hole TH8 so that the first patterned conductive layer 24 disposed beneath the first channel region CH1 and the first patterned conductive layer 24 disposed beneath the second channel region CH2 can be electrically connected to the second power line portion PL2 via the third connection portion X3 and the third extension portion E3. With the reference voltage provided by the second power line portion PL2, the device properties of the switch thin film transistor device and the driving thin film transistor device, such as the threshold voltage, are remained stable. The third patterned conductive layer 40 may further have a third power line portion PL3. The third power line portion PL3 is connected to the third connection portion X3 so that the third power line portion PL3 can be electrically connected to the second power line portion PL2 via the third connection portion X3 to deliver the reference voltage. Preferably, the third power line portion PL3 may have a mesh structure so as to reduce the resistance and improve the voltage stability, but not limited thereto. In other embodiments, the third power line portion PL3 may not have a mesh structure; although the resistance may be higher, the voltage stability may be still acceptable. The third patterned conductive layer 40 may be a single-layered or multiple-layered structure. Moreover, the third patterned conductive layer 40 may include opaque patterned conductive materials, and the opaque patterned conductive materials may be metal, such as at least one among gold, silver, copper, aluminum, titanium, molybdenum, niobium, alloys thereof, nitride thereof, oxide thereof, oxynitride thereof or organic conductive compounds thereof, but not limited thereto.

Figure 10:
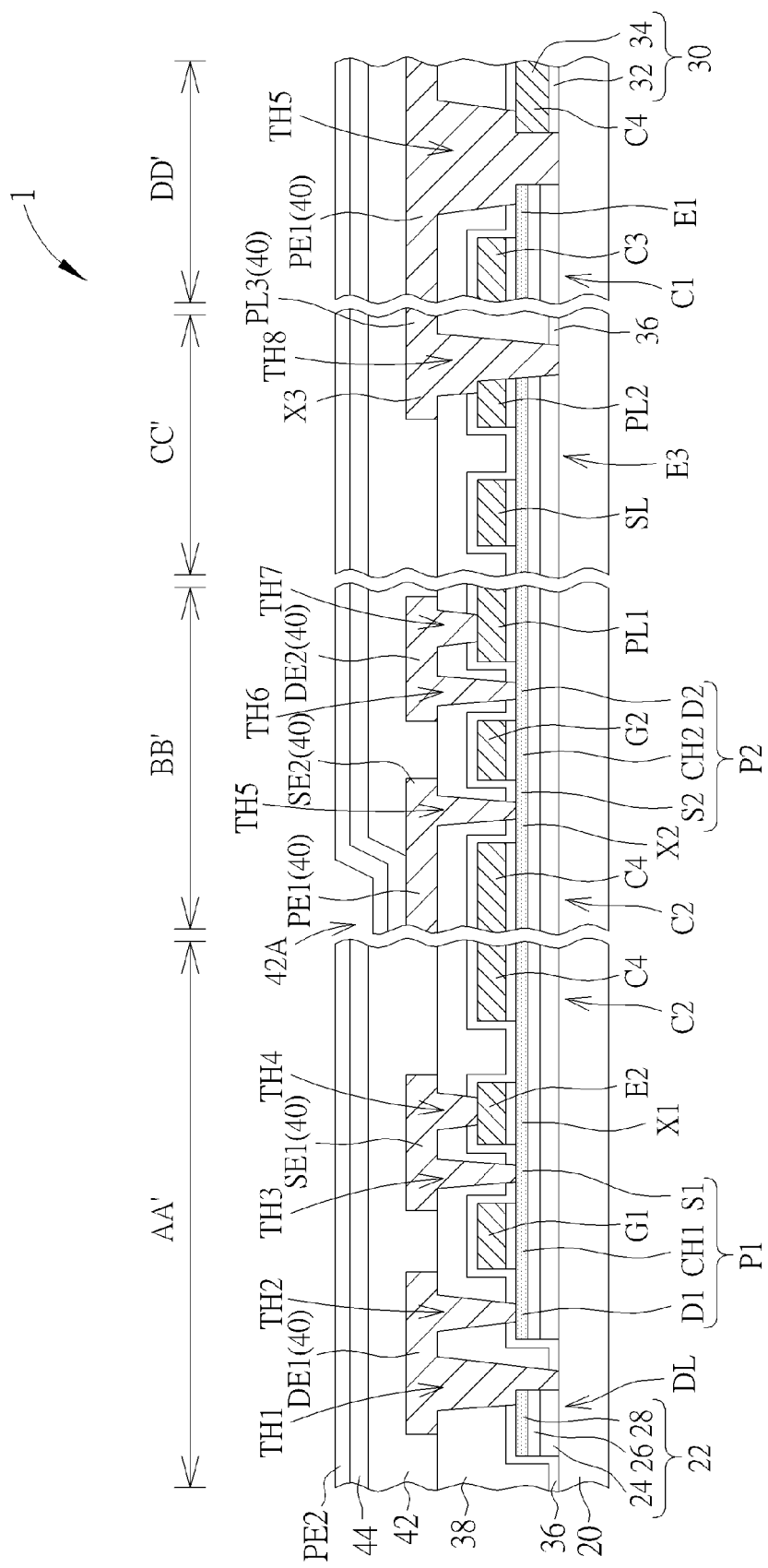

As shown in FIG. 10, a patterned bank 42 (also referred to as a patterned wall or a patterned barrier rib) may be selectively disposed on the third patterned conductive layer 40. The patterned bank 42 has at least one first opening 42A exposing the first electrode portion PE1. In other words, the patterned bank 42 is at least disposed on the data line portion DL and the scan line portion SL. In other embodiments, the patterned bank 42 may not be formed. Then, an electroluminescent layer 44 (or namely light emitting layer, self-emitting layer or luminous layer) is formed on the first electrode portion PE1 and a second electrode portion PE2 is formed on the luminous layer 44 so as to fabricate the electroluminescent display panel 1 of this embodiment. The luminous layer 44 may be driven by the first electrode portion PE1 and the second electrode portion PE2 to illuminate. The luminous layer 44 may include an organic electroluminescent layer. It depends on the required color of the emitted light for the luminous layer 44 to be a red luminous layer, a green luminous layer, a blue luminous layer, a yellow luminous layer, a white luminous layer or other luminous layer capable of emitting light of other color. The second electrode portion PE2 is preferably a transparent electrode, such as an indium tin oxide (ITO) electrode, and, in this case, the electroluminescent display panel 1 may be referred to as a top emission electroluminescent display panel, but not limited thereto. In other embodiments, the first electrode portion PE1 may be a transparent electrode while the second electrode portion PE2 is an opaque electrode, and, in this case, the electroluminescent display panel 1 may be referred to as a bottom emission electroluminescent display panel. The first electrode portion PE1 and the second electrode portion PE2 may both be transparent electrodes, and, in this case, the electroluminescent display panel 1 may be referred to as a double side emission electroluminescent display panel. The first electrode portion PE1, the second electrode portion PE2 and the luminous layer 44 constitute an electroluminescent device, and the first electrode portion PE1 and the second electrode portion PE2 respectively serve as the anode and the cathode. In addition, there may be other layers—such as at least one of a hole injection layer, a hole transport layer, an electron injection layer, an electron transport layer, a hole blocking layer, an electron blocking layer, a link layer (or namely connection layer) and other suitable layers—respectively disposed between the luminous layer 44 and the first electrode portion PE1 and between the luminous layer 44 and the second electrode portion PE2 according other design considerations.

Because the data line portion DL is formed from the first patterned conductive layer 24 according to the method of fabricating the electroluminescent display panel of this embodiment, because the scan line portion SL, the first power line portion PL1 and the second power line portion PL2 are formed from the second patterned conductive layer 34, and because the third power line portion PL3 is formed from the third patterned conductive layer 40, the tolerance in patterning processes may become higher and the aperture ratio may be increased. Moreover, the first patterned conductive layer 24 is an opaque patterned conductive layer and can be used as an alignment pattern so as to improve accuracy and precision of alignment operations in photolithography machines. Furthermore, although a lateral parasitic capacitor may be induced between the data line portion DL and the vertical third power line portion PL3 adjacent to the data line portion DL, the lateral parasitic capacitance of this embodiment induced between the data line portion DL and the vertical third power line portion PL3 adjacent to the data line portion DL is reduced since the data line portion DL and the third power line portion PL3 are formed from different patterned conductive layers. Last but not least, in this embodiment, the first patterned conductive layer 24 disposed beneath the first channel region CH1 of the switch thin film transistor device and the first patterned conductive layer 24 disposed beneath the second channel region CH2 of the driving thin film transistor device can be electrically connected to the second power line portion PL2 via the third connection portion X3 and the third extension portion E3. With the reference voltage provided by the second power line portion PL2, the device properties of the switch thin film transistor device and the driving thin film transistor device are remained stable.

Electroluminescent display panels and the methods of fabricating the same are not restricted to the preceding embodiments in the present disclosure. Other embodiments or modifications will be detailed in the following description. In order to simplify and show the differences or modifications between the following embodiments and the above-mentioned embodiment, the same numerals denote the same components in the following description, and the similar parts are not detailed redundantly.

Figure 11:
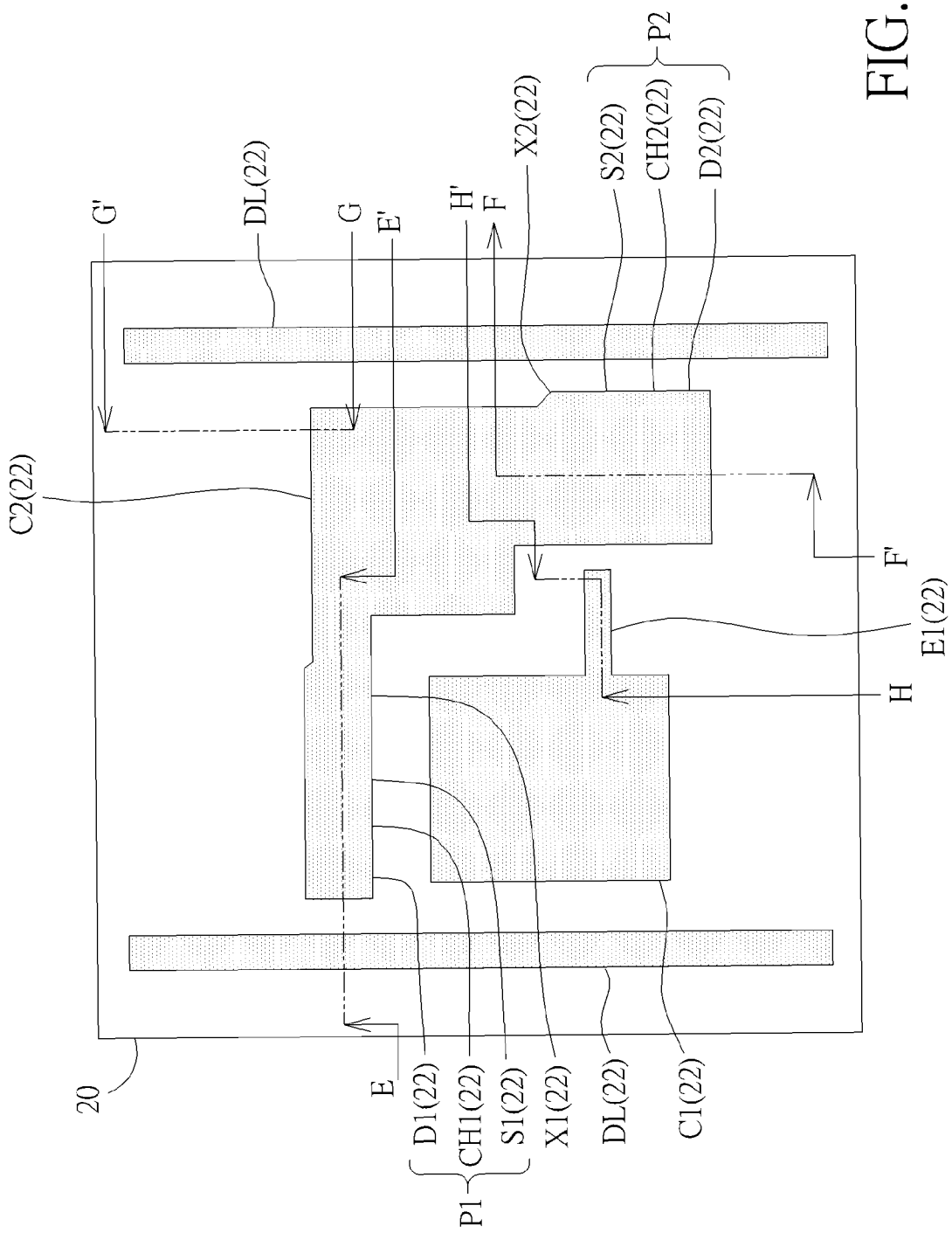
FIGS. 11-19 are schematic diagrams illustrating a method for fabricating an electroluminescent display panel according to a second embodiment of the present disclosure.
Figure 12:
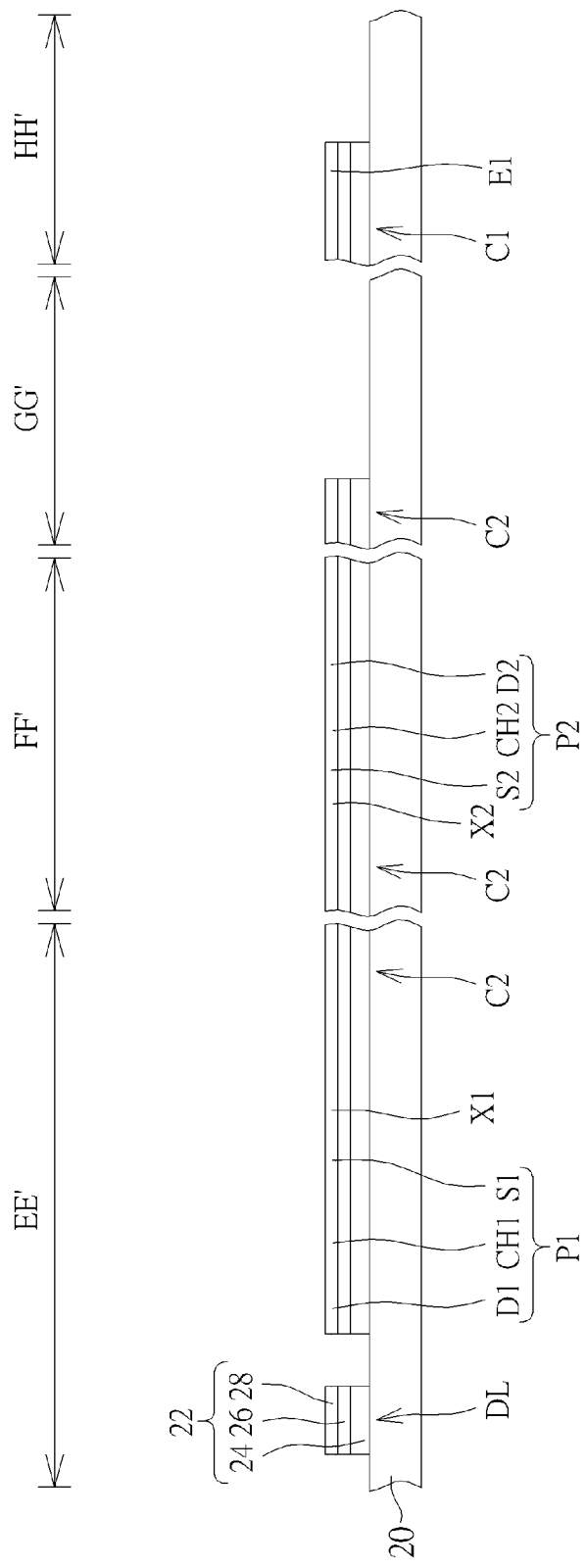

Please refer to FIGS. 11-19. FIGS. 11-19 are schematic diagrams illustrating a method for fabricating an electroluminescent display panel according to a second embodiment of the present disclosure. FIG. 11, FIG. 13, FIG. 15 and FIG. 17 are top-view schematic diagrams, while FIG. 12, FIG. 14, FIG. 16, FIG. 18 and FIG. 19 are cross-sectional view diagrams taken along cross-sectional lines E-E', F-F', G-G' and H-H' in FIG. 11, FIG. 13, FIG. 15 and FIG. 17. As shown in FIG. 11 and FIG. 12, a substrate 20 is first provided. A first multiple-layered structural layer 22 is formed on the substrate 20. The first multiple-layered structural layer 22 includes a first patterned conductive layer 24, a first patterned insulation layer 26 disposed on the first patterned conductive layer 24 and an oxide semiconductor layer 28 disposed on the first patterned insulation layer 26. The first multiple-layered structural layer 22 at least has a data line portion DL, a first capacitor portion C1, a second capacitor portion C2, a first portion P1, a second portion P2, a first connection portion X1, a second connection portion X2 and a first extension portion E1. The first connection portion X1 is disposed between the first portion P1 and the second capacitor portion C2 and is connected to the first portion P1 and the second capacitor portion C2. The second connection portion X2 is disposed between the second portion P2 and the second capacitor portion C2 and is connected to the second portion P2 and the second capacitor portion C2. The first extension portion E1 is connected to the first capacitor portion C1. Moreover, the first portion P1 has a first source region S1 (or namely first source electrode region), a first drain region D1 (or namely first drain electrode region) and a first channel region CH1 disposed between the first source electrode region S1 and the first drain electrode region D1. The second portion P2 has a second source region S2 (or namely second source electrode region), a second drain region D2 (or namely second drain electrode region) and a second channel region CH2 disposed between the second source electrode region S2 and the second drain electrode region D2. Different from the first embodiment, the first multiple-layered structural layer 22 in this embodiment does not include the third extension portion E3. In this embodiment, the material of the first patterned conductive layer 24, the first patterned insulation layer 26 and the oxide semiconductor layer 28 may be selected from the materials mentioned in the first embodiment, but not limited thereto. In this embodiment, the first patterned conductive layer 24, the first patterned insulation layer 26 and the oxide semiconductor layer 28 are patterned in the same photo and etching process, and hence the shape of the first patterned conductive layer 24, the shape of the first patterned insulation layer 26 and the shape of the oxide semiconductor layer 28 are substantially the same. For example, if the aforementioned elements are projected onto a plane, the contours of the aforementioned elements are substantially the same. The first patterned conductive layer 24 of this embodiment is an opaque patterned conductive layer and can be used as an alignment pattern so as to improve accuracy and precision of alignment operations in photolithography machines. In other embodiment, the first patterned conductive layer 24, the first patterned insulation layer 26 and the oxide semiconductor layer 28 are patterned in the different photo and etching process (PEP), and the shape of the first patterned conductive layer 24, the shape of the first patterned insulation layer 26 and the shape of the oxide semiconductor layer 28 to formed the shaped structure of the first multiple-layered structural layer 22 is taper or taper-like shaped structure.

Figure 13:
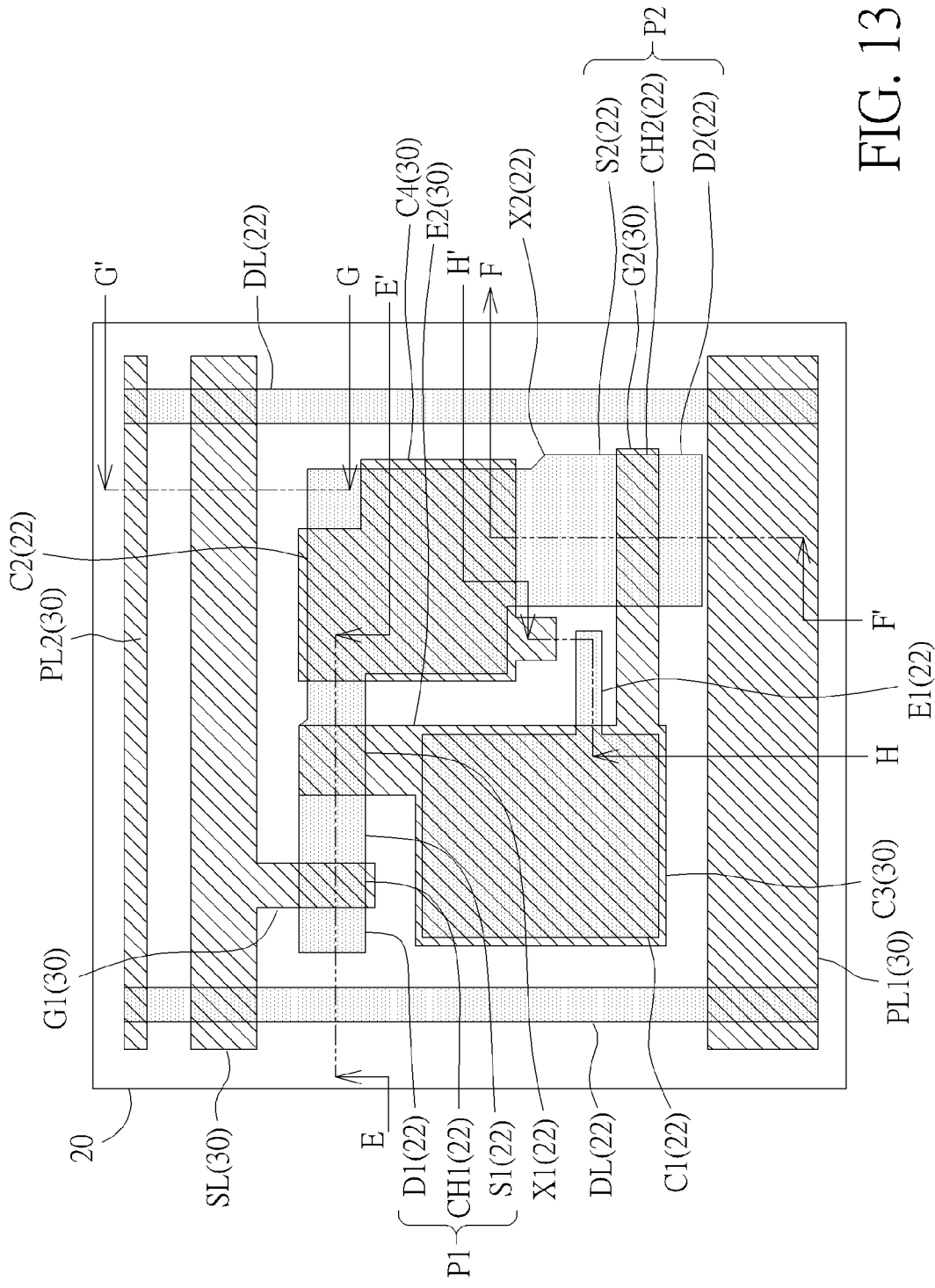
Figure 14:
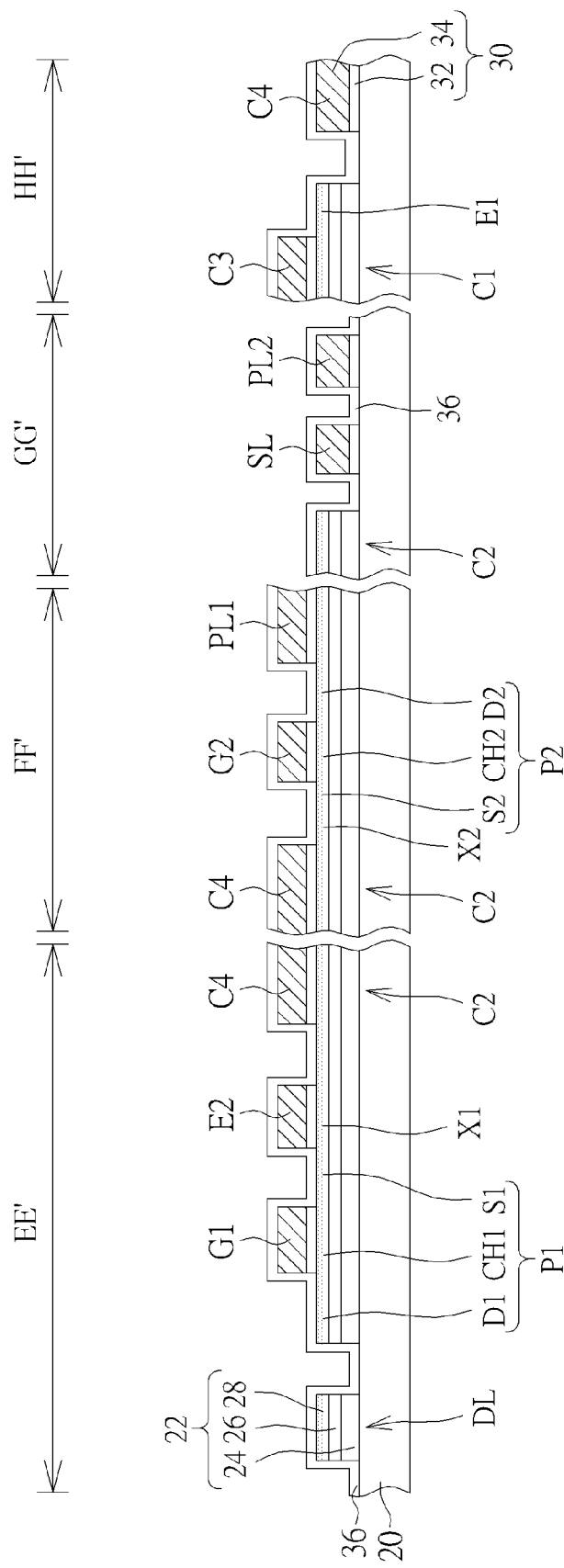

As shown in FIG. 13 and FIG. 14, a second multiple-layered structural layer 30 is subsequently formed on the first multiple-layered structural layer 22. The second multiple-layered structural layer 30 includes a second patterned insulation layer 32 and a second patterned conductive layer 34 disposed on second patterned insulation layer 32. The second multiple-layered structural layer 30 at least has a scan line portion SL, a first gate electrode portion G1, the second gate electrode portion G2, a third capacitor portion C3, a fourth capacitor portion C4, a second extension portion E2 and a first power line portion PL1. The first gate electrode portion G1 is connected to the scan line portion SL and extends to the first portion P1, and the first gate electrode portion G1 substantially corresponds to the first channel region CH1. The second gate electrode portion G2 is connected to the third capacitor portion C3 and extends to the second portion P2, and the second gate electrode portion G2 substantially corresponds to the second channel region CH2. The third capacitor portion C3 is disposed on the first capacitor portion C1. The first capacitor portion C1 and the third capacitor portion C3 constitute a storage capacitor (or namely a first storage capacitor). The fourth capacitor portion C4 is disposed on the second capacitor portion C2 and partially exposes the second capacitor portion C2. The second capacitor portion C2 and the fourth capacitor portion C4 constitute another storage capacitor (or namely a second storage capacitor). The second extension portion E2 is connected to the third capacitor portion C3 and extends to the first connection portion X1. The second multiple-layered structural layer 30 may further selectively include a second power line portion PL2. The voltage of the second power line portion PL2 is different from the voltage of the first power line portion PL1. For example, the first power line portion PL1 has a drive voltage, and the second power line portion PL2 has a reference voltage, which may be fixed (constant) voltage such as about 0 voltages or less than 0 voltages, or the second power line portion PL2 may be electrically connected to ground. In this embodiment, the material of the second patterned insulation layer 32 and the second patterned conductive layer 34 may be selected from the materials mentioned in the first embodiment, but not limited thereto. In this embodiment, the second patterned insulation layer 32 and the second patterned conductive layer 34 are patterned in the same photo and etching process, and hence the shape of the second patterned insulation layer 32 is substantially the same as the shape of the second patterned conductive layer 34. For example, if the aforementioned elements are projected onto a plane, the contours of the aforementioned elements are substantially the same. In other embodiment, the second patterned insulation layer 32 and the second patterned conductive layer 34 are patterned in the different photo and etching process (PEP), and the shape of the shape of the second patterned insulation layer 32 and the shape of the second patterned conductive layer 34 to formed the shaped structure of the second multiple-layered structural layer 30 is taper or taper-like shaped structure.

In this embodiment, the second multiple-layered structural layer 30 covers a portion of the first multiple-layered structural layer 22 and exposes a portion of the first multiple-layered structural layer 22. For example, the second multiple-layered structural layer 30 exposes a portion of the data line portion DL of the first multiple-layered structural layer 22, the first source electrode region S1, the first drain electrode region D1, the second source electrode region S2, the second drain electrode region D2, a portion of the first connection portion X1 and the first extension portion E1. In order to enhance the conductivity of the elements mentioned above, the method in the present disclosure may further selectively include performing conductivity-enhancing treatment on the first multiple-layered structural layer 22 exposed by the second multiple-layered structural layer 30. The conductivity-enhancing treatment of this embodiment may be the methods selected from those mentioned in the first embodiment, but not limited thereto.

Figure 15:
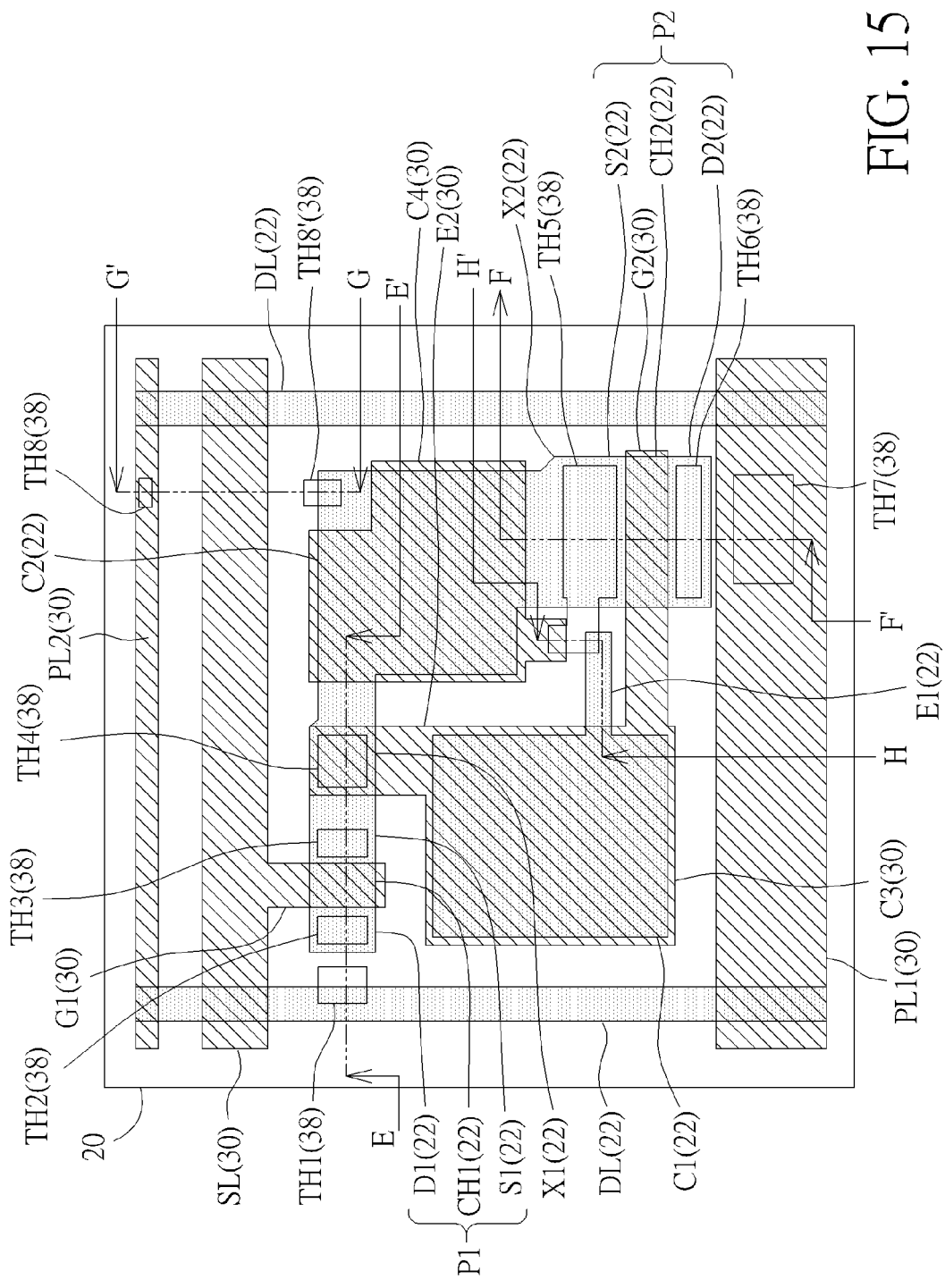
Figure 16:
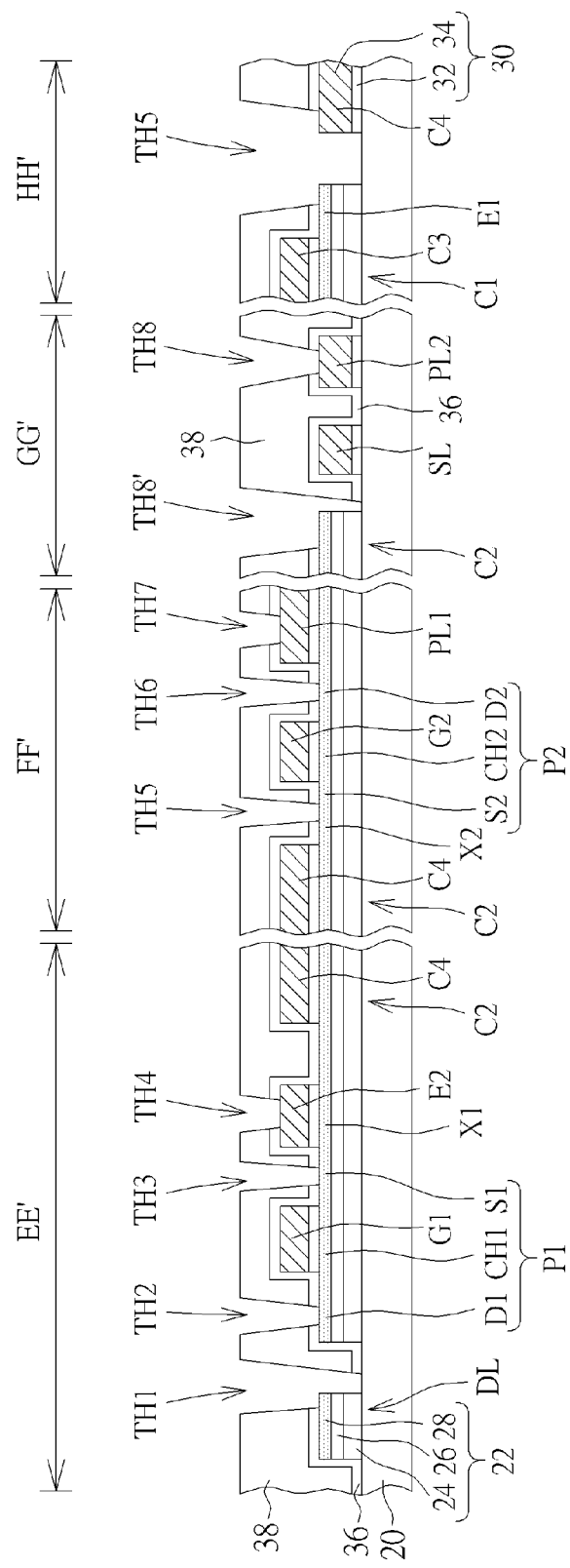

As shown in FIG. 15 and FIG. 16, a passivation layer 38 is then formed to cover the first multiple-layered structural layer 22, the second multiple-layered structural layer 30 and the substrate 20. The passivation layer 38 has a first contact hole TH1 (or namely first through hole), a second through hole TH2, a third through hole TH3, a fourth through hole TH4, a fifth through hole TH5, a sixth through hole TH6 and a seventh through hole TH7. The first through hole TH1 preferably corresponds to a portion of the top surface and a portion of the side surface of the data line portion DL. The second through hole TH2 corresponds to a portion of the first drain electrode region D1 of the first portion P1. The third through hole TH3 corresponds to a portion of the first source electrode region S1 of the first portion P1. The fourth through hole TH4 corresponds to a portion of the second extension portion E2. The fifth through hole TH5 corresponds to a portion of the second source electrode region S2 of the second portion P2, a portion of the fourth capacitor portion C4 and a portion of the first extension portion E1. The sixth through hole TH6 corresponds to a portion of the second drain electrode region D2 of the second portion P2. The seventh through hole TH7 corresponds to a portion of the first power line portion PL1. In addition, the passivation layer 38 may further have a plurality of eighth through holes TH8. The eighth through holes TH8 respectively correspond to a portion of the second power line portion PL2 and a portion of the second capacitor portion C2 exposed by the fourth capacitor portion C4. For example, one of the eighth through holes TH8 of the passivation layer 38 corresponds to a portion of the second power line portion PL2, while the other eighth through hole TH8' preferably corresponds to a portion of the top surface and a portion of the side surface of the second capacitor portion C2. In this embodiment, the material of the passivation layer 38 may be selected from the materials mentioned in the first embodiment, such as photosensitive materials, and the aforementioned through holes may be formed by exposure processes and development processes, but not limited thereto. Then, an etching process, such as a dry etching process, is performed to remove the metal layer 36 exposed by the above-mentioned through holes. Therefore, the first through hole TH1 preferably exposes a portion of the top surface and a portion of the side surface of the data line portion DL. The second through hole TH2 partially exposes the first drain electrode region D1 of the first portion P1. The third through hole TH3 partially exposes the first source electrode region S1 of the first portion P1. The fourth through hole TH4 partially exposes the second extension portion E2. The fifth through hole TH5 exposes a portion of the second source electrode region S2 of the second portion P2, a portion of the fourth capacitor portion C4 and a portion of the first extension portion E1. The sixth through hole TH6 partially exposes the second drain electrode region D2 of the second portion P2. The seventh through hole TH7 partially exposes the first power line portion PL1. The eighth through hole TH8 exposes a portion of the second power line portion PL2. The eighth through hole TH8' exposes a portion of the top surface and a portion of the side surface of the second capacitor portion C2. In this embodiment, a portion of the through holes, such as at least one of the first through hole TH1, the fifth through hole TH5 and the eighth through hole TH8', does not completely overlap the regions for the wires intentionally to be exposed but with position deviation. More specifically, preferably, a portion of the first through hole TH1 covers the top surface of the data line portion DL while the other does not so that the first through hole TH1 can expose a portion of the top surface and a portion of the side surface of the data line portion DL. Because the data line portion DL of this embodiment is a triple-layered structure stacked by the first patterned conductive layer 24, the oxide semiconductor layer 28 and the metal layer 36, and because the top surface and the side surface of the oxide semiconductor layer 28 and the side surface of the first patterned conductive layer 24 can be exposed simultaneously in one single etching process with the deviation between the first through hole TH1 and the data line portion DL, the first drain electrode formed subsequently can be electrically connected to the first patterned conductive layer 24 and the oxide semiconductor layer 28 simultaneously via the first through hole TH1, thereby enhancing the conductivity. Similarly, the fifth through hole TH5 exposes a portion of the top surface and a portion of the side surface of the first extension portion E1—namely, the fifth through hole TH5 exposes the top surface and the side surface of the oxide semiconductor layer 28 and the side surface of the first patterned conductive layer 24—so that the second source electrode formed subsequently can be electrically connected to the first patterned conductive layer 24 and the oxide semiconductor layer 28 simultaneously via the fifth through hole TH5. Furthermore, the eighth through hole TH8' exposes a portion of the top surface and a portion of the side surface of the second capacitor portion C2—that is, the eighth through hole TH8' exposes the top surface and the side surface of the oxide semiconductor layer 28 and the side surface of the first patterned conductive layer 24—so that the third connection portion formed subsequently can be electrically connected to the first patterned conductive layer 24 and the oxide semiconductor layer 28 simultaneously via the eighth through hole TH8. Moreover, in this embodiment, the fifth through hole TH5 may be one single through hole simultaneously exposing the second source electrode region S2, a portion of the fourth capacitor portion C4 and a portion of the first extension portion E1. However, in a variant embodiment, the fifth through hole TH5 may be a plurality of through holes respectively exposing the second source electrode region S2, a portion of the fourth capacitor portion C4 and a portion of the first extension portion E1.

Figure 17:
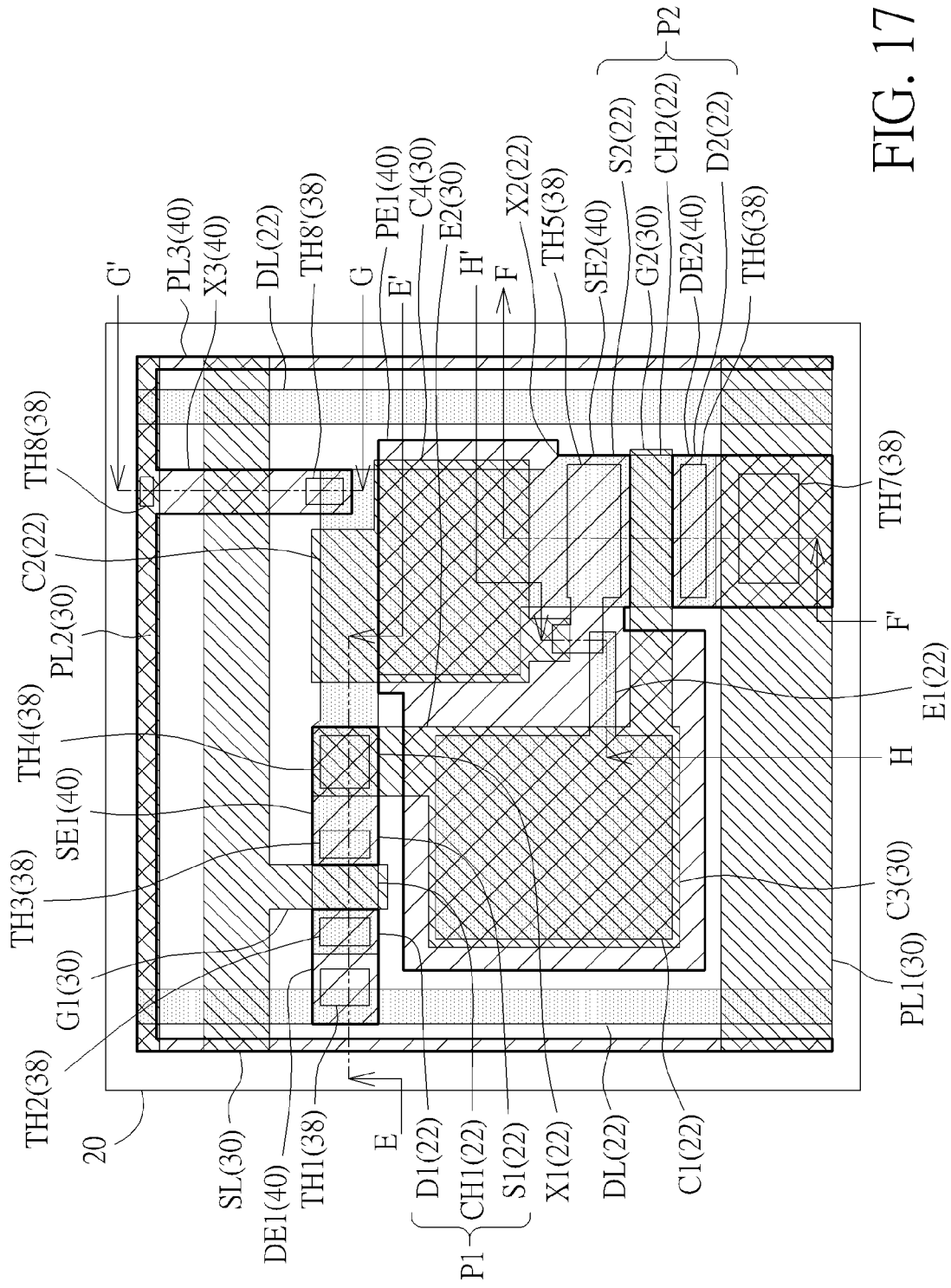
Figure 18:
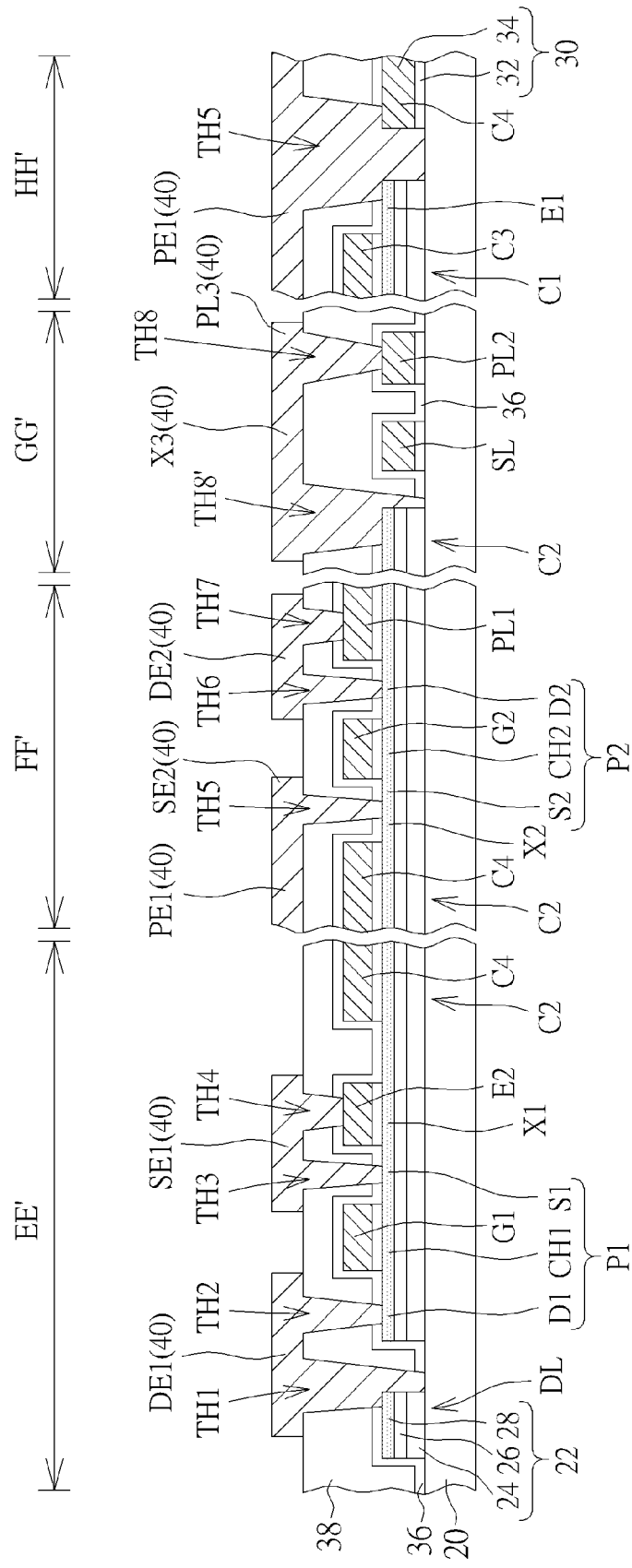

As shown in FIG. 17 and FIG. 18, a third patterned conductive layer 40 is subsequently formed on the passivation layer 38. The third patterned conductive layer 40 has a first drain electrode DE1, the first source electrode SE1, a first electrode portion PE1, a second drain electrode DE2 and a second source electrode SE2. The first drain electrode DE1 is in contact with the data line portion DL via the first through hole TH1 and in contact with the first drain electrode region D1 of the first portion P1 via the second through hole TH2. The first source electrode SE1 is in contact with the first source electrode region S1 of the first portion P1 via the third through hole TH3 and in contact with the second extension portion E2 via the fourth through hole TH4. The first electrode portion PE1 is disposed on the third capacitor portion C3 and the fourth capacitor portion C4 and is connected to the second source electrode SE2. The second source electrode SE2 is respectively in contact with the second source electrode region S2, the fourth capacitor portion C4 and the first extension portion E1 of the second portion P2 via the fifth through hole TH5. The second drain electrode DE2 is respectively in contact with the second drain electrode region D2 and the first power line portion PL1 of the second portion P2 via the sixth through hole TH6 and the seventh through hole TH7. The first gate electrode portion G1, the first channel region CH1, the first patterned conductive layer 24 disposed beneath the first channel region CH1 to be a base electrode, the first drain electrode DE1 and the first source electrode SE1 constitute a four-endpoint thin film transistor device serving as a switch thin film transistor device. The second gate electrode portion G2, the second channel region CH2, the first patterned conductive layer 24 disposed beneath the second channel region CH2 to be a base electrode, the second drain electrode DE2 and the second source electrode SE2 constitute another four-endpoint thin film transistor device serving as a driving thin film transistor device. Furthermore, in this embodiment, the third patterned conductive layer 40 may further selectively have a third connection portion X3. The third connection portion X3 is in contact with the second power line portion PL2 via the eighth through hole TH8 and in contact with the second capacitor portion C2 via the eighth through hole TH8'. The location of the third connection portion X3 in this embodiment and the number and the location of the eighth through hole TH8 and the eighth through hole TH8' in this embodiment are different from those in the first embodiment. However, the third connection portion X3 can still be electrically connected to the second power line portion PL2 and the first patterned conductive layer 24 via the eighth through hole TH8 and the eighth through hole TH8' so that the first patterned conductive layer 24 disposed beneath the first channel region CH1 and the first patterned conductive layer 24 disposed beneath the second channel region CH2 can be electrically connected to the second power line portion PL2. With the reference voltage provided by the second power line portion PL2, the device properties of the switch thin film transistor device and the driving thin film transistor device, such as the threshold voltage, are remained stable. The third patterned conductive layer 40 may further have a third power line portion PL3. The third power line portion PL3 is connected to the third connection portion X3 so that the third power line portion PL3 can be electrically connected to the second power line portion PL2 via the third connection portion X3 to deliver the reference voltage. Preferably, the third power line portion PL3 may have a mesh structure so as to reduce the resistance and improve the voltage stability, but not limited thereto. In other embodiments, the third power line portion PL3 may not have a mesh structure; although the resistance may be higher, the voltage stability may still be acceptable. In this embodiment, the material of the third patterned conductive layer 40 may be selected from the materials mentioned in the first embodiment, but not limited thereto.

Figure 19:
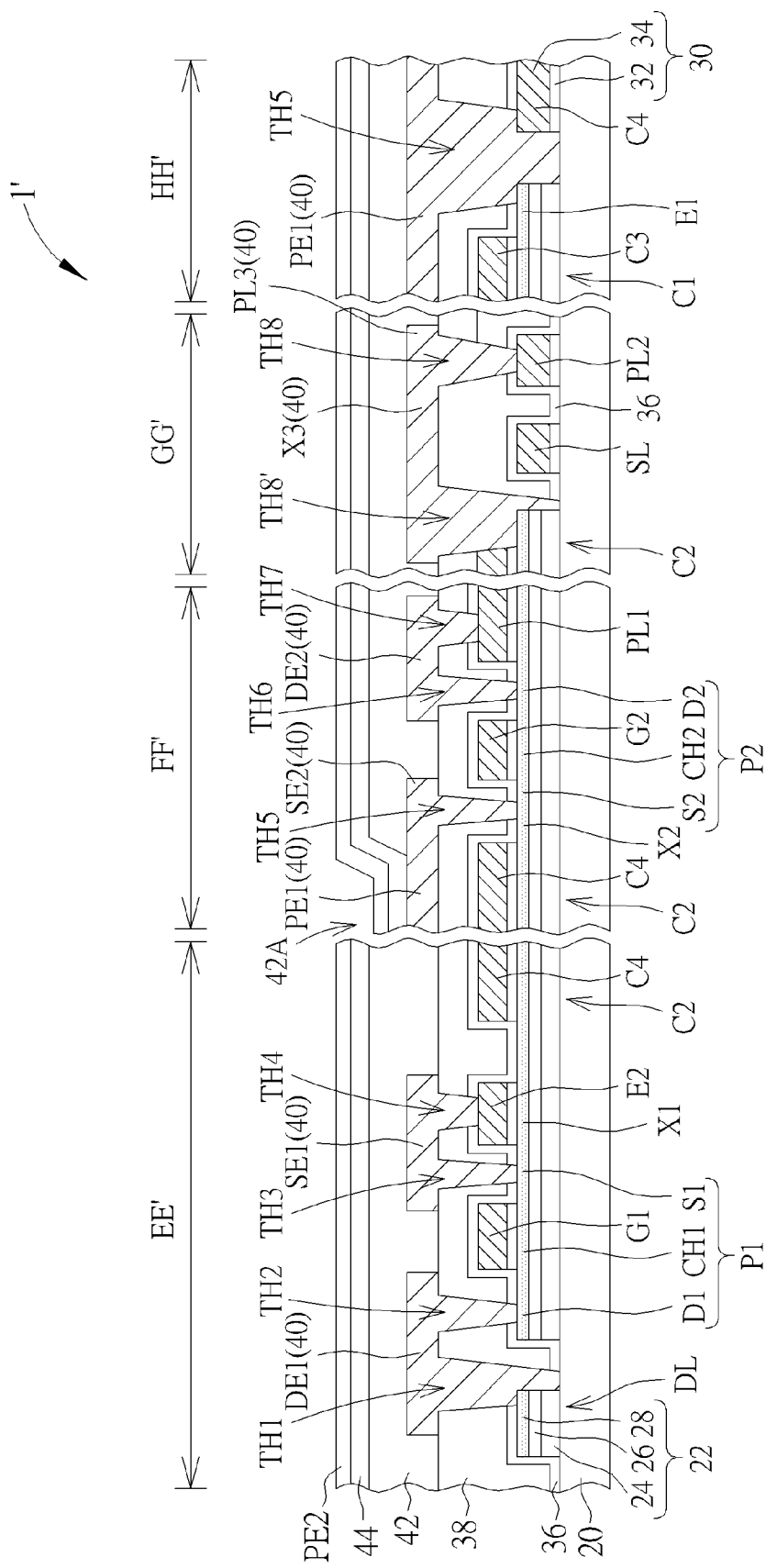

As shown in FIG. 19, a patterned bank 42 (or namely patterned wall or a patterned barrier rib) may be selectively disposed on the third patterned conductive layer 40. The patterned bank 42 has at least one first opening 42A exposing the first electrode portion PE1. In other words, the patterned bank 42 is at least disposed on the data line portion DL and the scan line portion SL. In other embodiments, the patterned bank 42 may not be formed. Then, an electroluminescent layer 44 (or namely light emitting layer, self-emitting layer or luminous layer) is formed on the first electrode portion PE1 and a second electrode portion PE2 is formed on the luminous layer 44 so as to fabricate the electroluminescent display panel 1' of this embodiment. The first electrode portion PE1, the second electrode portion PE2 and the luminous layer 44 constitute an electroluminescent device, and the first electrode portion PE1 and the second electrode portion PE2 respectively serve as the anode and the cathode. At least one of the first electrode portion PE1 and the second electrode portion PE2 may be a transparent electrode. In this embodiment, the material of the luminous layer 44 and the second electrode portion PE2 may be selected from the materials mentioned in the first embodiment, but not limited thereto.

Because the data line portion DL is formed from the first patterned conductive layer 24 according to the method of fabricating the electroluminescent display panel of this embodiment, because the scan line portion SL, the first power line portion PL1 and the second power line portion PL2 are formed from the second patterned conductive layer 34, and because the third power line portion PL3 is formed from the third patterned conductive layer 40, the tolerance in patterning processes is higher and the aperture ratio increases. Moreover, the first patterned conductive layer 24 is an opaque patterned conductive layer and can be used as an alignment pattern so as to improve accuracy and precision of alignment operations in photolithography machines. Furthermore, although a lateral parasitic capacitor may be induced between the data line portion DL and the vertical third power line portion PL3 adjacent to the data line portion DL, the lateral parasitic capacitance of this embodiment induced between the data line portion DL and the vertical third power line portion PL3 adjacent to the data line portion DL, which are disposed in the same layer, is reduced since the data line portion DL and the third power line portion PL3 are formed from different patterned conductive layers. Last but not least, in this embodiment, the first patterned conductive layer 24 disposed beneath the first channel region CH1 of the switch thin film transistor device and the first patterned conductive layer 24 disposed beneath the second channel region CH2 of the driving thin film transistor device can be electrically connected to the second power line portion PL2 via the third connection portion X3. With the reference voltage provided by the second power line portion PL2, the device properties of the switch thin film transistor device and the driving thin film transistor device are remained stable.

The electroluminescent display panel and the method of fabricating the same in the present disclosure are not limited to the above-mentioned embodiments. For example, a single pixel of the electroluminescent display panel is not limited to a structure including two thin film transistor devices and two storage capacitors (commonly referred to as a 2T2C structure), and the structure may be changed to a 2T1C structure, a 4T2C structure, a 5T1C structure, a 6T1C structure or other structures according design considerations.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electroluminescent display panel, comprising:
   a substrate; and
   one or a plurality of pixel structures, disposed on the substrate, the one or a plurality of pixel structures at least comprising:
      a first multiple-layered structural layer, disposed on the substrate, wherein the first multiple-layered structural layer comprises a first patterned conductive layer, a first patterned insulation layer disposed on the first patterned conductive layer and an oxide semiconductor layer disposed on the first patterned insulation layer, and a shape of the first patterned conductive layer, a shape of the first patterned insulation layer and a shape of the oxide semiconductor layer are substantially the same, wherein the first multiple-layered structural layer at least has a data line portion, a first capacitor portion, a second capacitor portion, a first portion, a second portion, a first connection portion, a second connection portion and a first extension portion, the first connection portion is disposed between the first portion and the second capacitor portion and is connected to the first portion and the second capacitor portion, the second connection portion is disposed between the second portion and the second capacitor portion and is connected to the second portion and the second capacitor portion, and the first extension portion is connected to the first capacitor portion, wherein the first portion has a first source electrode region, a first drain electrode region and a first channel region disposed between the first source electrode region and the first drain electrode region, and the second portion has a second source electrode region, a second drain electrode region and a second channel region disposed between the second source electrode region and the second drain electrode region;

a second multiple-layered structural layer, disposed on the first multiple-layered structural layer, wherein the second multiple-layered structural layer comprises a second patterned insulation layer and a second patterned conductive layer disposed on the second patterned insulation layer, and a shape of the second patterned insulation layer is substantially the same as a shape of the second patterned conductive layer, wherein the second multiple-layered structural layer at least has a scan line portion, a first gate electrode portion, a second gate electrode portion, a third capacitor portion, a fourth capacitor portion, a second extension portion and a first power line portion, the first gate electrode portion is connected to the scan line portion and extends to the first portion, the second gate electrode portion is connected to the third capacitor portion and extends to the second portion, the third capacitor portion is disposed on the first capacitor portion, the fourth capacitor portion is disposed on the second capacitor portion, and the second extension portion is connected to the third capacitor portion and extends to the first connection portion;

a passivation layer, covering and disposed on the first multiple-layered structural layer, the second multiple-layered structural layer and the substrate, wherein the passivation layer has a first through hole partially exposing a top surface and a side surface of the data line portion, a second through hole partially exposing the first drain electrode region of the first portion, a third through hole partially exposing the first source electrode region of the first portion, a fourth through hole partially exposing the second extension portion, at least one fifth through hole partially exposing the second source electrode region of the second portion, the fourth capacitor portion and the first extension portion respectively, a sixth through hole partially exposing the second drain electrode region of the second portion, and a seventh through hole partially exposing the first power line portion;

a third patterned conductive layer, disposed on the passivation layer, wherein the third patterned conductive layer has a first drain electrode, a first source electrode, a first electrode portion, a second drain electrode and a second source electrode, the first drain electrode is in contact with the data line portion via the first through hole and is in contact with the first drain electrode region of the first portion via the second through hole, the first source electrode is in contact with the first source electrode region of the first portion via the third through hole and is in contact with the second extension portion via the fourth through hole, the first electrode portion is disposed on the third capacitor portion and the fourth capacitor portion and is connected to the second source electrode, the second source electrode is in contact with the second source electrode region of the second portion, the fourth capacitor portion and the first extension portion via the fifth through hole respectively, and the second drain electrode is in contact with the second drain electrode region of the second portion and the first power line portion via the sixth through hole and the seventh through hole respectively;

a luminous layer, disposed on the first electrode portion; and a second electrode portion, disposed on the luminous layer.

2. The electroluminescent display panel according to claim 1, further comprising a patterned bank disposed on the third patterned conductive layer, wherein the patterned bank has at least one first opening to expose the first electrode portion, and at least one portion of the luminous layer is disposed in the first opening.

3. The electroluminescent display panel according to claim 1, wherein the second multiple-layered structural layer further comprises a second power line portion, and an applied voltage of the second power line portion is different from an applied voltage of the first power line portion.

4. The electroluminescent display panel according to claim 3, wherein the first multiple-layered structural layer further comprises a third extension portion connecting the first connection portion and the second capacitor portion, wherein the third extension portion extends to the second power line portion and partially overlaps the second power line portion.

5. The electroluminescent display panel according to claim 4, wherein the passivation layer further has an eighth through hole partially exposing the second power line portion and the third extension portion.

6. The electroluminescent display panel according to claim 5, wherein the third patterned conductive layer further has a third connection portion, and the third connection portion is in contact with the second power line portion and the third extension portion via the eighth through hole.

7. The electroluminescent display panel according to claim 3, wherein the passivation layer further has an eighth through hole partially exposing the second power line portion and the second capacitor portion.

8. The electroluminescent display panel according to claim 7, wherein the third patterned conductive layer further has a third connection portion, and the third connection portion is in contact with the second power line portion and the second capacitor portion via the eighth through hole.

9. A method of fabricating an electroluminescent display panel, comprising:
  providing a substrate; and
  forming one or a plurality of pixel structures on the substrate, wherein the method of forming the one or a plurality of pixel structures at least comprising:
    forming a first multiple-layered structural layer on the substrate, wherein the first multiple-layered structural layer comprises a first patterned conductive layer, a first patterned insulation layer disposed on the first patterned conductive layer and an oxide semiconductor layer disposed on the first patterned insulation layer, and a shape of the first patterned conductive layer, a shape of the first patterned insulation layer and a shape of the oxide semiconductor layer are substantially the same, wherein the first multiple-layered structural layer at least has a data line portion, a first capacitor portion, a second capacitor portion, a first portion, a second portion, a first connection portion, a second connection portion and a first extension portion, the first connection portion is disposed between the first portion and the second capacitor portion and is connected to the first portion and the second capacitor portion, the second connection portion is disposed between the second portion and the second capacitor portion and is connected to the second portion and the second capacitor portion, and the first extension portion is connected to the first capacitor portion, wherein the first portion has a first source electrode region, a first drain electrode region and a first channel region disposed between the first source electrode region and the first drain electrode region, and the second portion has a second source electrode region, a second drain electrode region and a second channel region disposed between the second source electrode region and the second drain electrode region;

forming a second multiple-layered structural layer on the first multiple-layered structural layer, wherein the second multiple-layered structural layer comprises a second patterned insulation layer and a second patterned conductive layer disposed on the second patterned insulation layer, and a shape of the second patterned insulation layer is substantially the same as a shape of the second patterned conductive layer, wherein the second multiple-layered structural layer at least has a scan line portion, a first gate electrode portion, a second gate electrode portion, a third capacitor portion, a fourth capacitor portion, a second extension portion and a first power line portion, the first gate electrode portion is connected to the scan line portion and extends to the first portion, the second gate electrode portion is connected to the third capacitor portion and extends to the second portion, the third capacitor portion is disposed on the first capacitor portion, the fourth capacitor portion is disposed on the second capacitor portion, and the second extension portion is connected to the third capacitor portion and extends to the first connection portion;

forming a passivation layer on the first multiple-layered structural layer, the second multiple-layered structural layer and the substrate, wherein the passivation layer has a first through hole partially exposing a top surface and a side surface of the data line portion, a second through hole partially exposing the first drain electrode region of the first portion, a third through hole partially exposing the first source electrode region of the first portion, a fourth through hole partially exposing the second extension portion, a fifth through hole partially exposing the second source electrode region of the second portion, the fourth capacitor portion and the first extension portion respectively, a sixth through hole partially exposing the second drain electrode region of the second portion, and a seventh through hole partially exposing the first power line portion;

forming a third patterned conductive layer on the passivation layer, wherein the third patterned conductive layer has a first drain electrode, a first source electrode, a first electrode portion, a second drain electrode and a second source electrode, the first drain electrode is in contact with the data line portion via the first through hole and is in contact with the first drain electrode region of the first portion via the second through hole, the first source electrode is in contact with the first source electrode region of the first portion via the third through hole and is in contact with the second extension portion via the fourth through hole, the first electrode portion is disposed on the third capacitor portion and the fourth capacitor portion and is connected to the second source electrode, the second source electrode is in contact with the second source electrode region of the second portion, the fourth capacitor portion and the first extension portion via the fifth through hole respectively, and the second drain electrode is in contact with the second drain electrode region of the second portion and the first power line portion via the sixth through hole and the seventh through hole respectively;

forming a luminous layer on the first electrode portion; and forming a second electrode portion on the luminous layer.

10. The method of fabricating the electroluminescent display panel according to claim 9, further comprising disposing a patterned bank on the third patterned conductive layer, wherein the patterned bank has at least one first opening to expose the first electrode portion, and at least one portion of the luminous layer is disposed in the first opening.

11. The method of fabricating the electroluminescent display panel according to claim 9, wherein the second multiple-layered structural layer further comprises a second power line portion, and an applied voltage of the second power line portion is different from an applied voltage of the first power line portion.

12. The method of fabricating the electroluminescent display panel according to claim 11, wherein the first multiple-layered structural layer further comprises a third extension portion connecting the first connection portion and the second capacitor portion, wherein the third extension portion extends to the second power line portion and partially overlaps the second power line portion.

13. The method of fabricating the electroluminescent display panel according to claim 12, wherein the passivation layer further has an eighth through hole partially exposing the second power line portion and the third extension portion.

14. The method of fabricating the electroluminescent display panel according to claim 13, wherein the third patterned conductive layer further has a third connection portion, and the third connection portion is in contact with the second power line portion and the third extension portion via the eighth through hole.

15. The method of fabricating the electroluminescent display panel according to claim 11, wherein the passivation layer further has an eighth through hole partially exposing the second power line portion and the second capacitor portion.

16. The method of fabricating the electroluminescent display panel according to claim 15, wherein the third patterned conductive layer further has a third connection portion, and the third connection portion is in contact with the second power line portion and the second capacitor portion via the eighth through hole.

* * * * *